(12) United States Patent
Kim et al.

(10) Patent No.: US 11,342,244 B2
(45) Date of Patent: May 24, 2022

(54) BONDED ASSEMBLY OF SEMICONDUCTOR DIES CONTAINING PAD LEVEL ACROSS-DIE METAL WIRING AND METHOD OF FORMING THE SAME

(71) Applicant: SANDISK TECHNOLOGIES LLC, Addison, TX (US)

(72) Inventors: Jee-Yeon Kim, San Jose, CA (US); Kwang-Ho Kim, Pleasanton, CA (US); Fumiaki Toyama, Cupertino, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 152 days.

(21) Appl. No.: 16/747,943

(22) Filed: Jan. 21, 2020

(65) Prior Publication Data

US 2021/0225736 A1    Jul. 22, 2021

(51) Int. Cl.
H01L 23/48       (2006.01)
H01L 25/065      (2006.01)
H01L 21/768      (2006.01)
H01L 23/00       (2006.01)

(52) U.S. Cl.
CPC ...... *H01L 23/481* (2013.01); *H01L 21/76805* (2013.01); *H01L 21/76877* (2013.01); *H01L 24/05* (2013.01); *H01L 24/45* (2013.01); *H01L 25/0657* (2013.01)

(58) Field of Classification Search
CPC .................................................... H01L 23/481
See application file for complete search history.

(56) References Cited

U.S. PATENT DOCUMENTS

| | | |
|---|---|---|
| 5,915,167 A | 6/1999 | Leedy |
| 8,378,892 B2 | 2/2013 | Sorvala et al. |
| 10,115,681 B1 | 10/2018 | Ariyoshi |
| 10,283,493 B1 | 5/2019 | Nishida |
| 10,354,980 B1 | 7/2019 | Mushiga et al. |

(Continued)

OTHER PUBLICATIONS

Endoh et al., "Novel Ultra High Density Memory with a Stacked-Surrounding Gate Transistor (S-SGT) Structured Cell," IEDM Proc., (2001), 33-36.

(Continued)

*Primary Examiner* — William A Harriston
(74) *Attorney, Agent, or Firm* — The Marbury Law Group PLLC

(57) ABSTRACT

Through-substrate via structures are formed in a semiconductor substrate of a first semiconductor die. Semiconductor devices, dielectric material layers, and metal interconnect structures are formed over a front surface of the semiconductor substrate. A backside dielectric layer is formed on a backside surface. Integrated line and pad structures are formed over the backside dielectric layer on a respective through-substrate via structure. Each of the integrated line and pad structures includes a respective pad portion and respective line portion that extends from a center region of the backside surface to toward a periphery of the backside surface. A bonded assembly including the first semiconductor die and a second semiconductor die can be formed. Bonding pads can be provided in a center region of the interface between the semiconductor dies to facilitate power and signal distribution in the second semiconductor die with less electrical wiring.

20 Claims, 20 Drawing Sheets

(56) References Cited

U.S. PATENT DOCUMENTS

| | | | |
|---|---|---|---|
| 10,354,987 | B1 | 7/2019 | Mushiga et al. |
| 10,381,322 | B1 | 8/2019 | Azuma et al. |
| 10,381,362 | B1 | 8/2019 | Cui et al. |
| 10,510,738 | B2 | 12/2019 | Kim et al. |
| 2008/0088511 | A1 | 4/2008 | Sorvala et al. |
| 2015/0137350 | A1 | 5/2015 | Huang et al. |
| 2016/0049201 | A1* | 2/2016 | Lue ............... G11C 16/16 365/185.11 |
| 2016/0343666 | A1 | 11/2016 | Deshpande et al. |
| 2017/0047343 | A1* | 2/2017 | Lee ............... H01L 27/11575 |
| 2017/0154868 | A1 | 6/2017 | Jo |
| 2017/0162266 | A1* | 6/2017 | Seol ............... G11C 16/3459 |
| 2017/0179154 | A1* | 6/2017 | Furihata ............... H01L 21/76802 |
| 2018/0301374 | A1* | 10/2018 | Masamori ............... H01L 27/11582 |
| 2019/0019838 | A1 | 1/2019 | Kropelnicki et al. |
| 2019/0043879 | A1* | 2/2019 | Lu ............... H01L 23/5226 |
| 2019/0221520 | A1 | 7/2019 | Kim et al. |
| 2019/0221557 | A1 | 7/2019 | Kim et al. |

OTHER PUBLICATIONS

U.S. Appl. No. 16/231,752, filed Dec. 24, 2018, SanDisk Technologies LLC.
U.S. Appl. No. 16/242,216, filed Jan. 8, 2019, SanDisk Technologies LLC.
U.S. Appl. No. 16/248,923, filed Jan. 16, 2019, SanDisk Technologies LLC.
U.S. Appl. No. 16/249,423, filed Jan. 16, 2019, SanDisk Technologies LLC.
U.S. Appl. No. 16/255,413, filed Jan. 23, 2019, SanDisk Technologies LLC.
U.S. Appl. No. 16/269,301, filed Feb. 6, 2019, SanDisk Technologies LLC.
U.S. Appl. No. 16/274,687, filed Feb. 13, 2019, SanDisk Technologies LLC.
U.S. Appl. No. 16/275,668, filed Feb. 14, 2019, SanDisk Technologies LLC.
U.S. Appl. No. 16/278,372, filed Feb. 18, 2019, SanDisk Technologies LLC.
U.S. Appl. No. 16/284,502, filed Feb. 25, 2019, SanDisk Technologies LLC.
U.S. Appl. No. 16/288,656, filed Feb. 28, 2019, SanDisk Technologies LLC.
U.S. Appl. No. 16/291,457, filed Mar. 4, 2019, SanDisk Technologies LLC.
U.S. Appl. No. 16/291,504, filed Mar. 4, 2019, SanDisk Technologies LLC.
U.S. Appl. No. 16/291,577, filed Mar. 4, 2019, SanDisk Technologies LLC.
U.S. Appl. No. 16/295,292, filed Mar. 7, 2019, SanDisk Technologies LLC.
U.S. Appl. No. 16/372,908, filed Apr. 2, 2019, SanDisk Technologies LLC.
U.S. Appl. No. 16/385,010, filed Apr. 16, 2019, SanDisk Technologies LLC.
U.S. Appl. No. 16/391,632, filed Apr. 23, 2019, SanDisk Technologies LLC.
U.S. Appl. No. 16/404,844, filed May 7, 2019, SanDisk Technologies LLC.
U.S. Appl. No. 16/404,961, filed May 7, 2019, SanDisk Technologies LLC.
U.S. Appl. No. 16/409,593, filed May 10, 2019, SanDisk Technologies LLC.
U.S. Appl. No. 16/417,913, filed May 21, 2019, SanDisk Technologies LLC.
U.S. Appl. No. 16/440,183, filed Jun. 13, 2019, SanDisk Technologies LLC.
U.S. Appl. No. 16/521,849, filed Jul. 25, 2019, SanDisk Technologies LLC.
U.S. Appl. No. 16/523,029, filed Jul. 26, 2019, SanDisk Technologies LLC.
U.S. Appl. No. 16/547,971, filed Aug. 22, 2019, SanDisk Technologies LLC.
U.S. Appl. No. 16/552,089, filed Aug. 27, 2019, SanDisk Technologies LLC.
U.S. Appl. No. 16/589,404, filed Oct. 1, 2019, SanDisk Technologies LLC.
U.S. Appl. No. 16/660,177, filed Oct. 22, 2019, SanDisk Technologies LLC.
U.S. Appl. No. 16/666,522, filed Oct. 29, 2019, SanDisk Technologies LLC.
U.S. Appl. No. 16/671,025, filed Oct. 31, 2019, SanDisk Technologies LLC.
U.S. Appl. No. 16/675,459, filed Nov. 6, 2019, SanDisk Technologies LLC.
U.S. Appl. No. 16/682,848, filed Nov. 13, 2019, SanDisk Technologies LLC.
U.S. Appl. No. 16/694,340, filed Dec. 25, 2019, SanDisk Technologies LLC.
U.S. Appl. No. 16/694,438, filed Nov. 25, 2019, SanDisk Technologies LLC.
U.S. Appl. No. 16/728,327, filed Dec. 27, 2019, SanDisk Technologies LLC.
Notification of Transmittal of the International Search Report and Written Opinion of the International Search Authority for International Patent Application No. PCT/US2020/036804, dated Nov. 2, 2020, 11 pages.

* cited by examiner

BONDED ASSEMBLY OF SEMICONDUCTOR DIES CONTAINING PAD LEVEL ACROSS-DIE METAL WIRING AND METHOD OF FORMING THE SAME

FIELD

The present disclosure relates generally to the field of semiconductor devices, and particularly to a bonded assembly containing pad level across-die metal wiring in conjunction with through-die metal wiring and methods of forming the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a semiconductor structure comprising a first semiconductor die is provided. The first semiconductor die comprises: a first semiconductor substrate having a front surface and a backside surface; first semiconductor devices located over the front surface of the first semiconductor substrate; first metal interconnect structures embedded in first dielectric material layers located on the first semiconductor devices, wherein the first metal interconnect structures comprise power-and-control-signal lines located in a power and control signal connection region in a middle portion of the first semiconductor die; a first backside dielectric layer located on the backside surface of the first semiconductor substrate; integrated line and pad structures including a respective first pad portion that is more proximal to a periphery of the backside surface of the first semiconductor substrate than to a geometrical center of the backside surface of the first semiconductor substrate, and including a respective first line portion that extends continuously from the respective first pad portion to a distal end region of the respective first line portion that is more proximal to the geometrical center than to the periphery of the backside surface; and power-and-control-signal through-substrate via structures that electrically connect a respective one of the power-and-control-signal lines located in the power and control signal connection region to the distal end region of the line portion of a respective one of the integrated line and pad structures.

According to another embodiment of the present disclosure, a bonded assembly comprises a first semiconductor die and a second semiconductor die bonded to the first semiconductor die. The first semiconductor die comprises a first semiconductor substrate having a front surface and a backside surface; memory devices located over the front surface of the first semiconductor substrate; first metal interconnect structures embedded in first dielectric material layers located on the first semiconductor devices, wherein the first metal interconnect structures comprise power-and-control-signal lines located in a power and control signal connection region in a middle portion of the first semiconductor die; and first bonding pads comprising power-and-control-signal bonding pads located in the power and control signal connection region and electrically connected to the power-and-control-signal lines. The second semiconductor die comprises: a sense amplifier circuit region; second semiconductor devices located in a peripheral control circuit region that form a peripheral control circuit for controlling operation of the memory devices; second bonding pads that are located in a logic-side power-and-control-signal-path bonding pad region in a middle portion of the second semiconductor die and that are bonded to the power-and-control-signal bonding pads; and second metal interconnect structures which electrically connect the second semiconductor devices in the peripheral control circuit region to the second bonding pads without passing over the sense amplifier circuit region.

According to another embodiment of the present disclosure, a method of forming a semiconductor structure is provided, which comprises: forming first semiconductor devices over a front surface of a first semiconductor substrate; forming first through-substrate via structures in the first semiconductor substrate; forming first dielectric material layers embedding first metal interconnect structures over the first semiconductor devices; forming a first backside dielectric layer on a backside surface of the first semiconductor substrate; and forming integrated line and pad structures over the first backside dielectric layer on a respective one of the first through-substrate via structures, wherein each of the integrated line and pad structures comprises a respective first pad portion that is more proximal to a periphery of the backside surface of the first semiconductor substrate than to a geometrical center of the backside surface of the first semiconductor substrate, and comprises a respective first line portion that extends continuously from the respective first pad portion to a distal end region of the respective first line portion that is more proximal to the geometrical center than to the periphery of the backside surface.

DETAILED DESCRIPTION

Figure 1A:
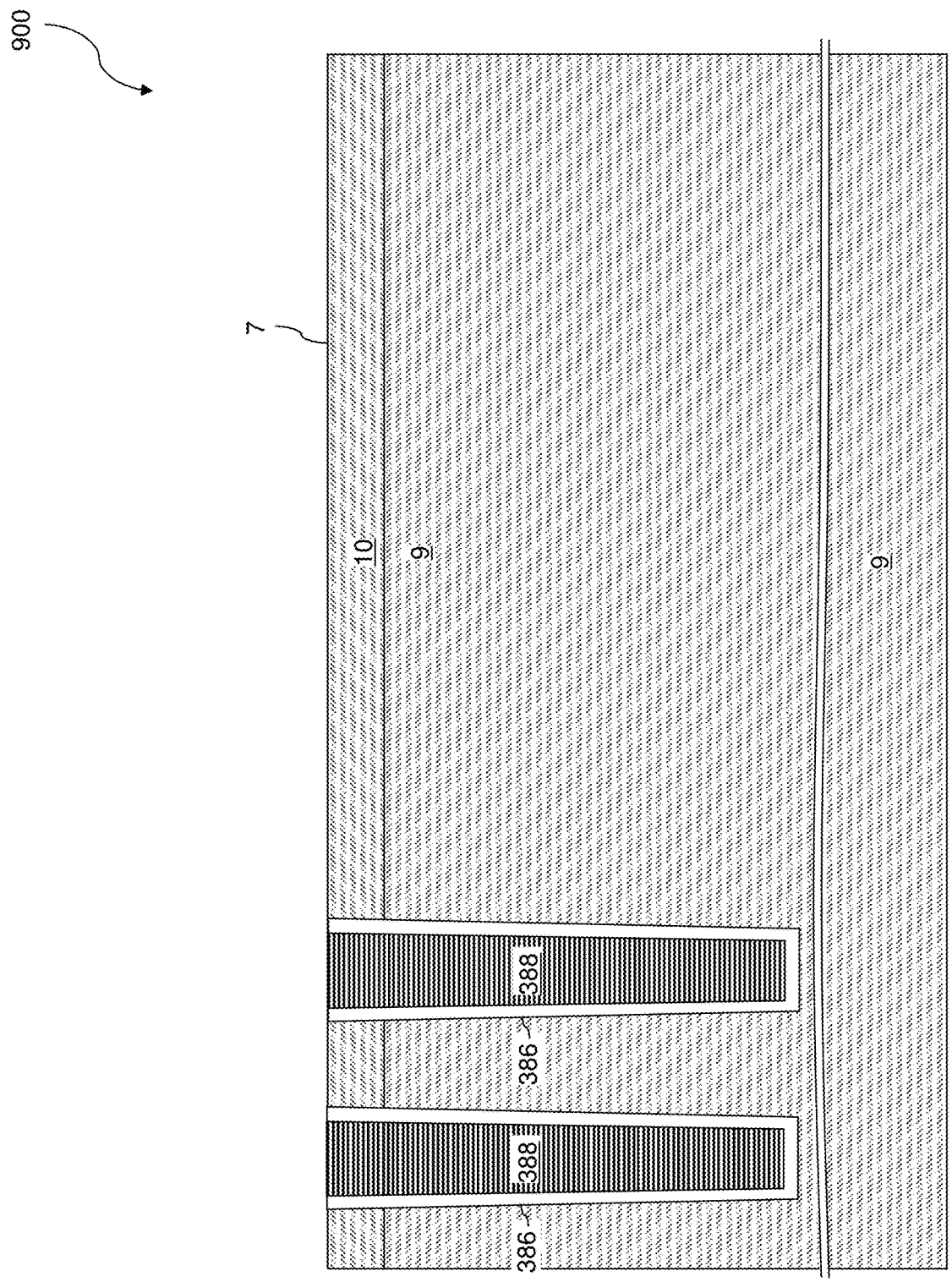
FIG. 1A is a vertical cross-sectional view of a region of a first semiconductor die after formation of through-substrate via structures according to an embodiment of the present disclosure.

As discussed above, the embodiments of the present disclosure are directed to a structure containing pad level across-die metal wiring in conjunction with through-die metal wiring and methods of forming the same, the various aspects of which are described herein in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and may be fabricated using the various embodiments described herein.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. Each plane contains a number of memory blocks (or "blocks"), which are the smallest unit that may be erased by in a single erase operation. Each memory block contains a number of pages, which are the smallest units that may be selected for programming.

Figure 1B:
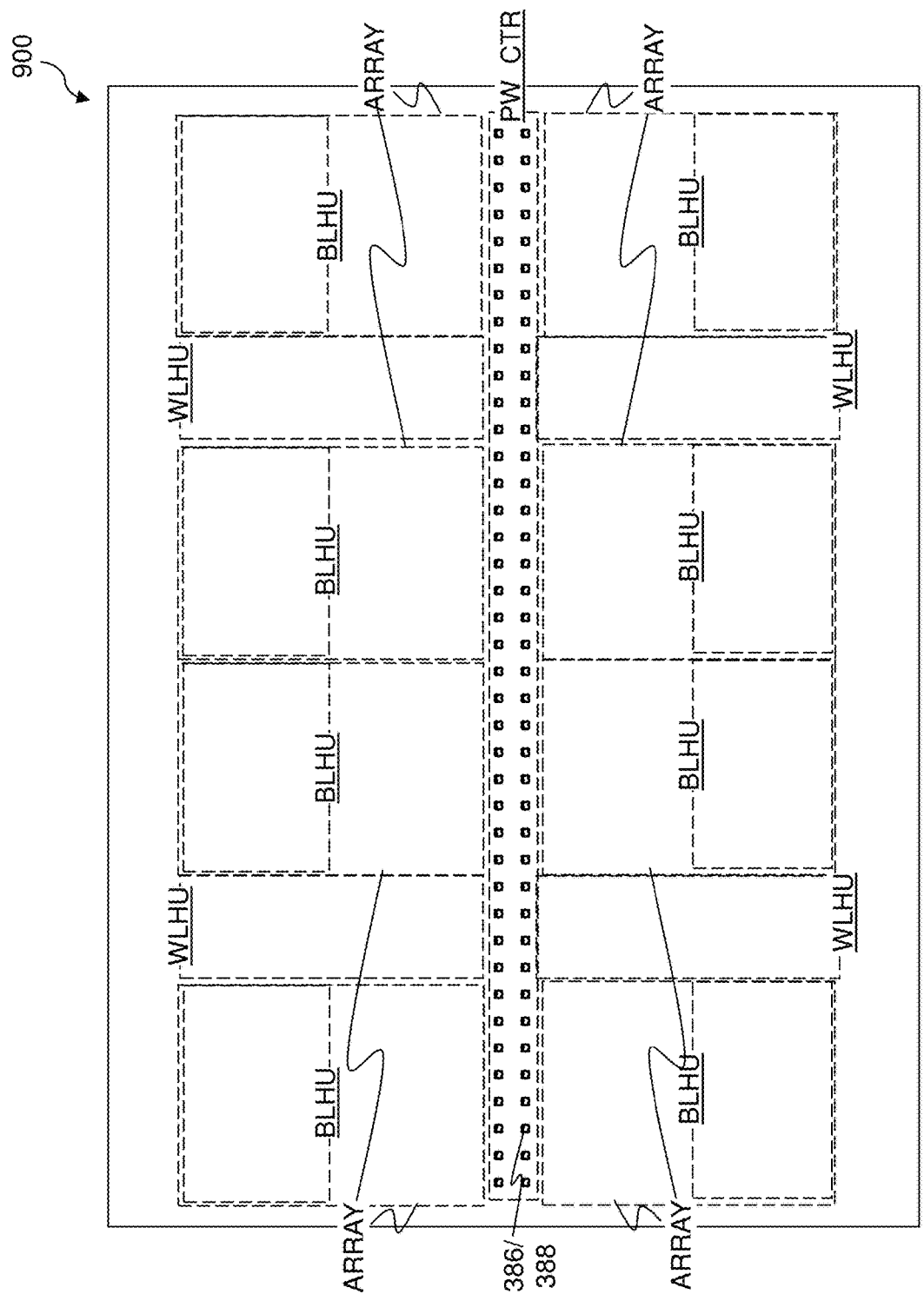
FIG. 1B is a top-down view of the first semiconductor die of FIG. 1A.

Referring to FIGS. 1A and 1B, a first semiconductor die 900 according to an embodiment of the present disclosure is illustrated. The first semiconductor die 900 is an in-process memory die, and can comprise a portion of a semiconductor substrate such as a semiconductor (e.g., silicon) wafer. The semiconductor substrate is herein referred to as a first semiconductor substrate (9, 10). A plurality of semiconductor dies 900 can be arranged as a periodic rectangular array within the semiconductor wafer. Each semiconductor die 900 includes a respective portion of a first substrate semiconductor layer 9, which includes a semiconductor material such as single crystalline silicon. A first semiconductor material layer 10 can be provided on, or within, a top portion of the first substrate semiconductor layer 9. The first semiconductor material layer 10 can include a single crystalline semiconductor material having a doping of a first conductivity type, which may be p-type or n-type. The first semiconductor material layer 10 may be epitaxially aligned to the first substrate semiconductor layer 9. The thickness of the first semiconductor material layer 10 can be in a range from 100 nm to 2,000 nm, although lesser and greater thicknesses can also be employed. The top surface of the first semiconductor material layer 10 can be a front surface 7 of the first semiconductor substrate (9, 10).

A three-dimensional memory device can be subsequently formed within each semiconductor die 900. The layout of each semiconductor die 900 includes various device regions for allocating various components of the three-dimensional memory device. The various device regions can include memory array regions (labeled "ARRAY" in FIG. 1B), bit line hook-up regions (labeled "BLHU" in FIG. 1B), word line hook-up regions (labeled "WLHU" in FIG. 1B), and a power and control signal connection region (labeled "PW_CTR" in FIG. 1B). The memory array regions are regions in which a respective three-dimensional memory array is formed. Each bit line hookup region is a region in which bit line connection structures are formed. The bit line hookup regions can be located within the memory array regions. The bit line connection structures are metal interconnect structures and bonding pads for providing interconnection between the bit lines of a respective three-dimensional memory array and bit line driver circuits to be provided in a second semiconductor die to be subsequently provided. Each word line hookup region is a region in which word line connection structures are formed. The word line connection structures are metal interconnect structures and bonding pads for providing interconnection between the word lines of a respective three-dimensional memory array and word line driver circuits to be provided in the second semiconductor die. The power and control signal connection region is a region in which metal interconnect structures and bonding pads for distributing power and control signals are subsequently provided.

According to an aspect of the present disclosure, the power and control signal connection region can extend from one side of the first semiconductor die 900, through a middle portion of the first semiconductor die 900 to another side of the first semiconductor die 900. The middle portion of the first semiconductor die 900 includes the middle 50% of the area of the first semiconductor die 900 and excludes the area of two edge portions which include 25% of the area of the first semiconductor die 900 located on opposite sides of the middle portion. In one embodiment, the middle portion of the first semiconductor die 900 includes a geometrical center of the first semiconductor die 900. The power and control signal connection region extends through at least a part of the middle portion of the first semiconductor die 900, and in one embodiment may extend over the geometrical center of the first semiconductor die 900. The power and control signal connection region may optionally extend through the area of one or more edge portions. Generally, external bonding pads for wire bonding and/or bump bonding are located at edges of a semiconductor chip. In case the semiconductor chip includes a bonded pair of semiconductor dies, power distribution pads at the bonding interfaces are located in areas that overlap with the external bonding pads to utilize vertical electrical connection between the external bonding pads and the power distribution pads. In other words, placement of the power distribution pads in the middle portion of a semiconductor die has been avoided in the prior art. In the first semiconductor die 900 of the embodiments of the present disclosure, the power and control signal connection region is located in the middle portion of the first semiconductor die 900. The middle portion includes the geometrical center of the first semiconductor die 900. Placement of the power and control signal connection region in the middle portion of the first semiconductor die 900 reduces the wiring distance for distributing the power and the control signal within the first semiconductor die 900 and avoids an extra level of metal interconnects in the second (e.g., logic) die that is used in the prior art to extend the power and control signal metal interconnects from the edge of the bonded assembly over the sense amplifier circuit region to the peripheral control circuit region, as will be discussed below.

According to an embodiment of the present disclosure, deep trenches can be formed on the front side of the first semiconductor substrate (9, 10) within the power and control signal connection region PW_CTR. In one embodiment, the power and control signal connection region PW_CTR can have a rectangular shape that extends from one side of the first semiconductor die 900 to another side of the first semiconductor die 900 through a center region of the first semiconductor die 900. The deep trenches can be isolated trenches that are arranged along the lengthwise direction of the power and control signal connection region PW_CTR. The deep trenches may be arranged in a single row or in a plurality of rows that extend along the lengthwise direction of the power and control signal connection region PW_CTR.

For example, a hard mask layer (not shown) such as a silicon nitride layer can be deposited on the front surface of the first semiconductor substrate (9, 10). A photoresist layer (not shown) can be applied over the hard mask layer, and can be lithographically patterned to form isolated openings therethrough. The isolated openings can have a circular shape, an elliptical shape, or a polygonal shape with a maximum lateral dimension (such as a diameter of a major axis) in a range from 0.5 micron to 10 microns, such as from 1 micron to 5 microns. An anisotropic etch process can be performed to transfer the pattern of discrete openings in the photoresist layer into the hard mask layer. The hard mask layer can be subsequently employed as an etch mask layer during another anisotropic etch process that transfers the pattern of the openings in the hard mask layer into an upper portion of the first semiconductor substrate (9, 10), thereby forming the deep trenches. The depth of the deep trenches can be in a range from 5 microns to 20 microns, although lesser and greater depths can also be employed. The pitch of the deep trenches along the lengthwise direction of the power and control signal connection region PW_CTR can be the same as the pitch of bonding pads to be subsequently formed in the first semiconductor die 900. In an illustrative example, the pitch of the deep trenches along the lengthwise direction of the power and control signal connection region PW_CTR can be in a range from 0.6 micron to 60 microns, such as from 1 microns to 20 microns. The deep trenches can have straight sidewalls or bowed sidewalls depending on the etch chemistry employed to form the deep trenches.

A dielectric material such as silicon oxide can be conformally deposited in the deep trenches. The dielectric material can have a thickness in a range from 50 nm to 500 nm, although lesser and greater thicknesses can also be employed. At least one conductive fill material can be deposited in remaining volumes of the deep trenches. The at least one conductive fill material can include, for example, a metallic liner material such as TiN, TaN, and WN, and a metallic fill material such as tungsten. Excess portions of the at least one conductive material and the dielectric material can be removed from above the front surface 7 of the first semiconductor substrate (9, 10) by a planarization process such as a chemical mechanical planarization process. Each remaining portion of the dielectric material within a respective deep trench forms a dielectric liner, which is herein referred to as a through-substrate dielectric liner 386. Each remaining portion of the at least one conductive fill material in a respective deep trench forms a conductive structure, wherein is herein referred to as a through-substrate via structure 388.

The through-substrate via structures 388 can be formed within the area of the power and control signal connection region PW_CTR. Optionally, additional through-substrate via structures 388 can be formed in the memory array regions ARRAY. the bit line hook-up regions BLHU, and/or the word line hook-up regions WLHU. For example, the additional through-substrate via structures 388 can be formed along edges of the first semiconductor die 900 within areas that overlap with areas of external bonding pads to be subsequently formed on the backside surface of the first semiconductor substrate (9, 10) after a thinning process.

Figure 2:
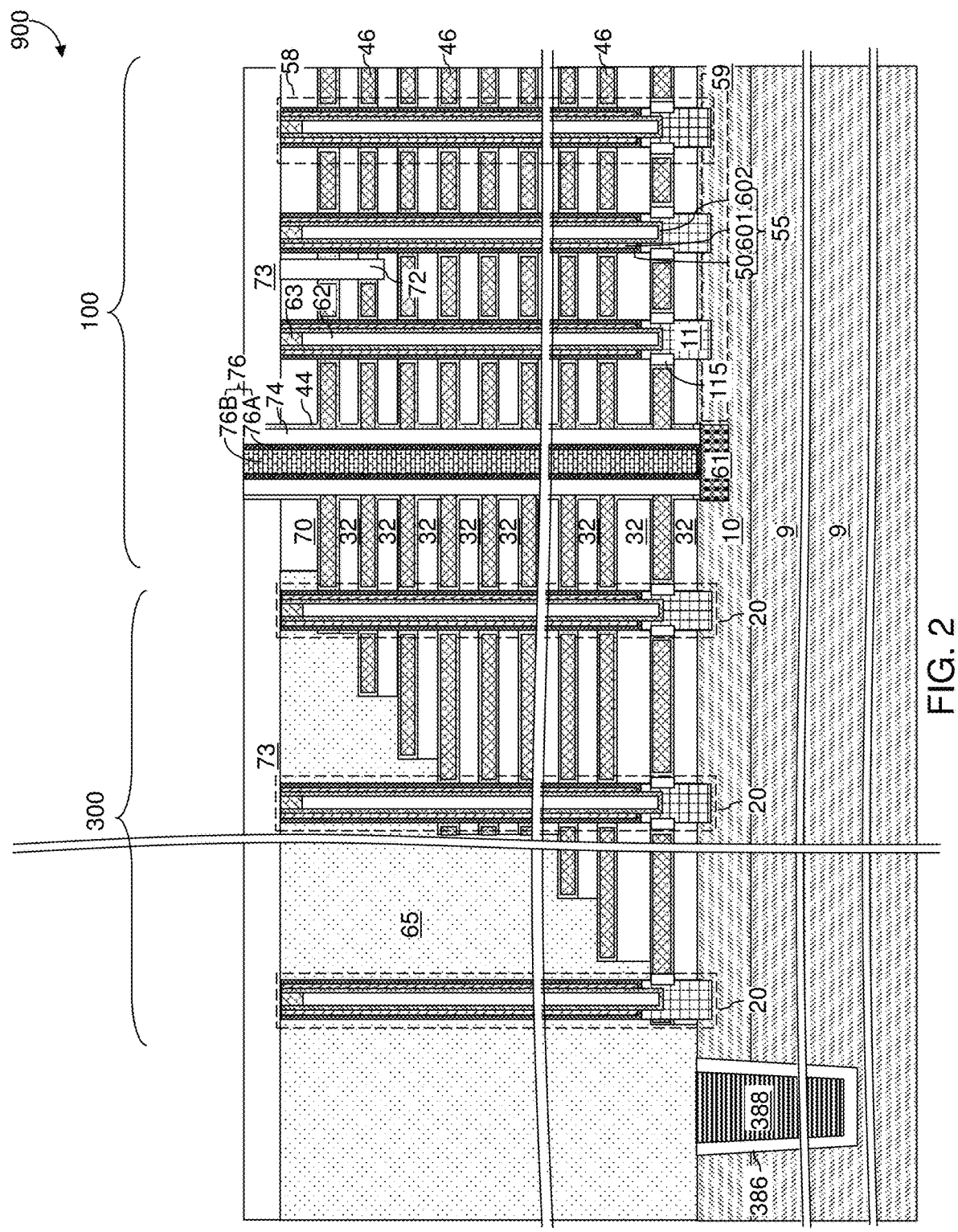
FIG. 2 is a vertical cross-sectional view of a region of the first semiconductor die after formation of first semiconductor devices including a three-dimensional memory array according to an embodiment of the present disclosure.

Referring to FIG. 2, first semiconductor devices can be formed on the front surface 7 of the first semiconductor substrate (9, 10). For example, a three-dimensional memory device is formed over the front surface of the first semiconductor substrate (9, 10). For example, an alternating stack of insulating layers 32 and sacrificial material layers (not shown) are formed. An insulating cap layer 70 may be formed over the alternating stack. Drain-select-level isolation structures 72 may be optionally formed through topmost layers of the alternating stack. The insulating cap layer 70 and the alternating stack may be patterned to form stepped surfaces, and a retro-stepped dielectric material portion 65 may be formed over the stepped surfaces. Memory openings may be formed through the insulating cap layer 70 and the alternating stack to a top surface of the first semiconductor substrate (9, 10) in a memory array region 100. Support openings may be formed through the retro-stepped dielectric material portion 65 and patterned portions of the alternating stack to a top surface of the first semiconductor substrate (9, 10) in a staircase region 300. The memory array region 100 can be located within a respective one of the memory array regions labeled "ARRAY" in FIG. 1B. The staircase region 300 can be located within one of the word line hook-up regions "WLHU" in FIG. 1B.

Referring back to FIG. 2, a memory opening fill structure 58 may be formed in each memory opening, and a support pillar structure 20 may be formed in each support opening. Each memory opening fill structure 58 and each support pillar structure 20 may include a pedestal channel portion 11, a memory film 50 that may include a layer stack, from outside to inside, of a blocking dielectric, a charge storage layer, and a tunneling dielectric, a vertical semiconductor channel 60 that may include a memory films 50, memory-die semiconductor channel layer 601 and a second semiconductor channel layer 602, an optional dielectric core 62, and a drain region 63. A lower contact-level dielectric layer 73 may be formed over the insulating cap layer 70 and the retro-stepped dielectric material portion 65. Backside trenches may be formed through the lower contact-level dielectric layer 73 and the alternating stack to a top surface of the first semiconductor substrate (9, 10). Backside recesses may be formed by removing the sacrificial material layers of the alternating stack. Physically exposed surfaces of the pedestal channel portions may be oxidized to form tubular dielectric spacers 115. The sacrificial material layers may be replaced with an optional backside blocking dielectric liner 44 and electrically conductive layers 46 that include word lines. Portions of the charge storage layer that are surrounded by the word lines constitute memory elements, which are arranged as a three-dimensional array of memory elements.

Generally, the first semiconductor devices can include a three-dimensional memory array that comprises an alternating stack of insulating layers 32 and electrically conductive layers 46 that alternate along a vertical direction that is perpendicular to the front surface 7 of the first semiconductor substrate (9, 10). Memory stack structures 55 vertically extend through the alternating stack (32, 46). Each of the memory stack structures 55 comprises a respective vertical semiconductor channel 60 and a respective memory film 50. A source region 61 may be formed at the bottom of each backside trench. A horizontal semiconductor channel 59 is formed between each source region 61 and a neighboring group of pedestal channel portions 11 in the memory openings. An insulating spacer 74 and a source contact structure 76 may be formed in each backside trench. Each source contact structure 76 can include a source contact metallic liner 76A and a source contact metallic fill material portion 76B.

Figure 3A:
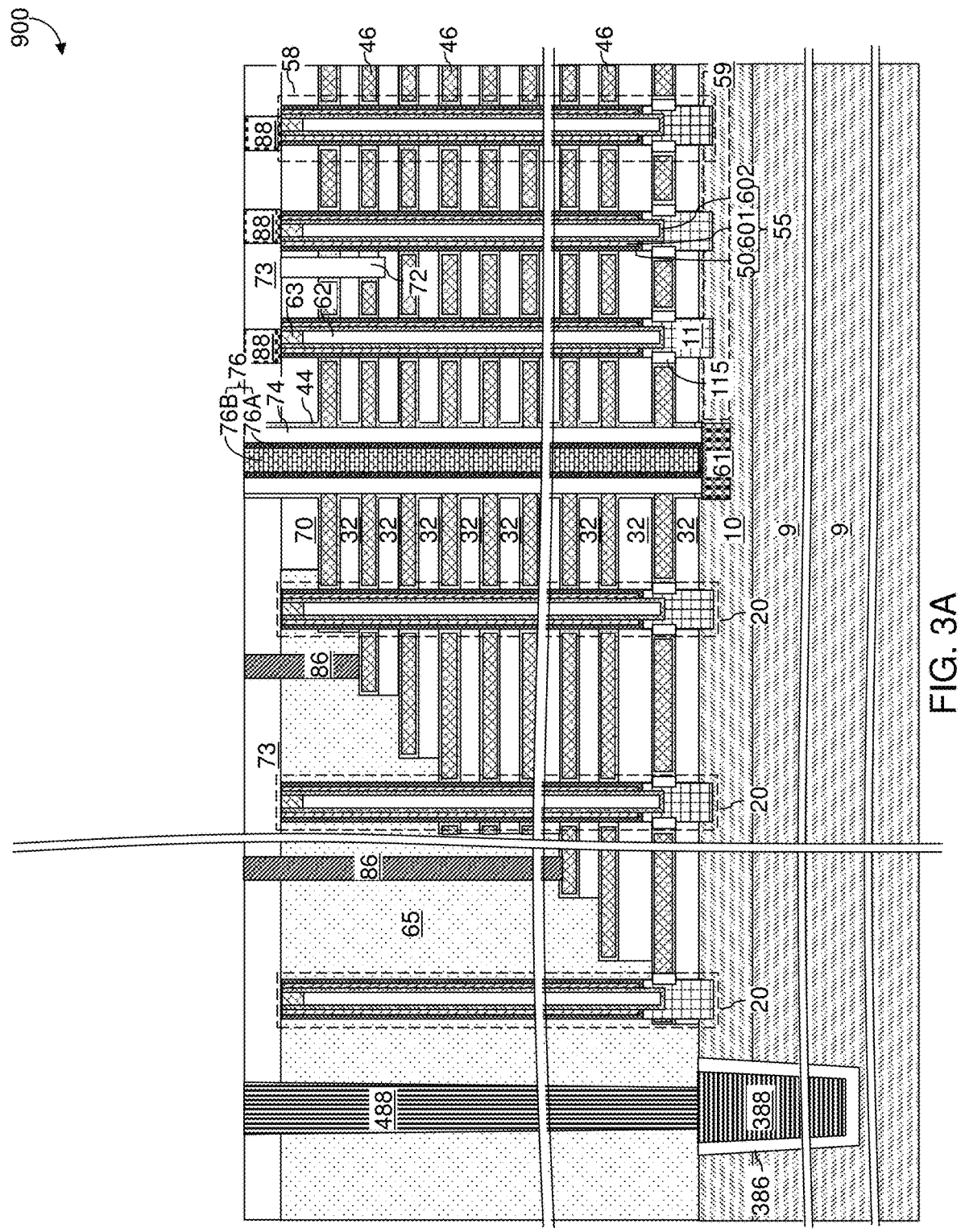
FIG. 3A is a vertical cross-sectional view of a region of the first semiconductor die after formation of through-device-level via structures including a three-dimensional memory array according to an embodiment of the present disclosure.
Figure 3B:
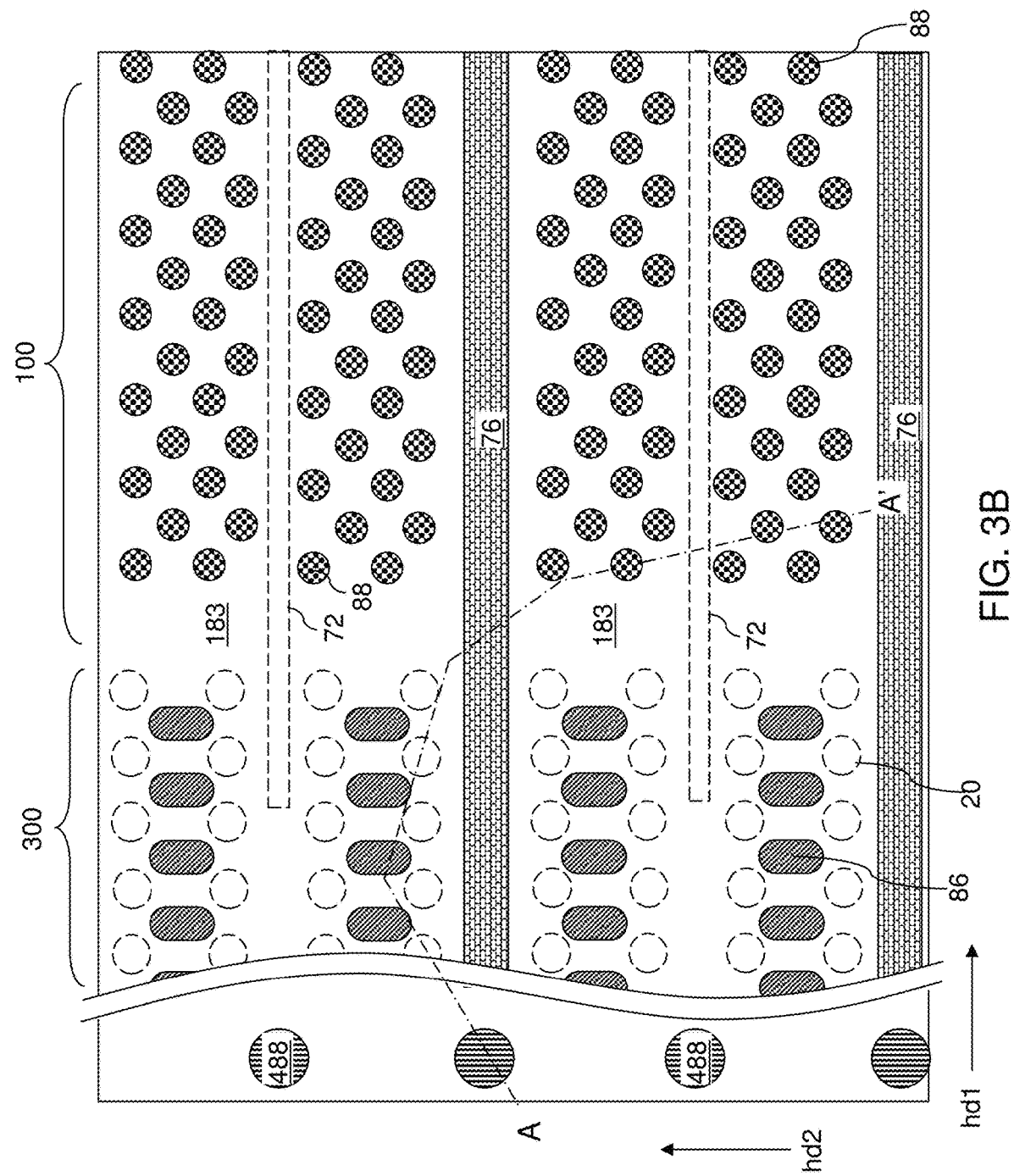
FIG. 3B is a top-down view of the region of the first semiconductor die of FIG. 3A.

Referring to FIGS. 3A and 3B, layer contact via structures 86 including word line contact via structures may be formed through the lower contact-level dielectric layer 73 and the retro-stepped dielectric material portion 65 on each electrically conductive layer 46. Drain contact via structures 88 can be formed through the lower contact-level dielectric layer 73 on a top surface of a respective one of the drain regions 63. Through-memory-level connection via structures 488 can be formed through the lower contact-level dielectric layer 73 and the retro-stepped dielectric material portion 65 on a top surface of a respective one of the in-substrate conductive via structures 388. Each in-substrate conductive via structure 388 can be contacted by a respective through-memory-level connection via structures 488.

Figure 4A:
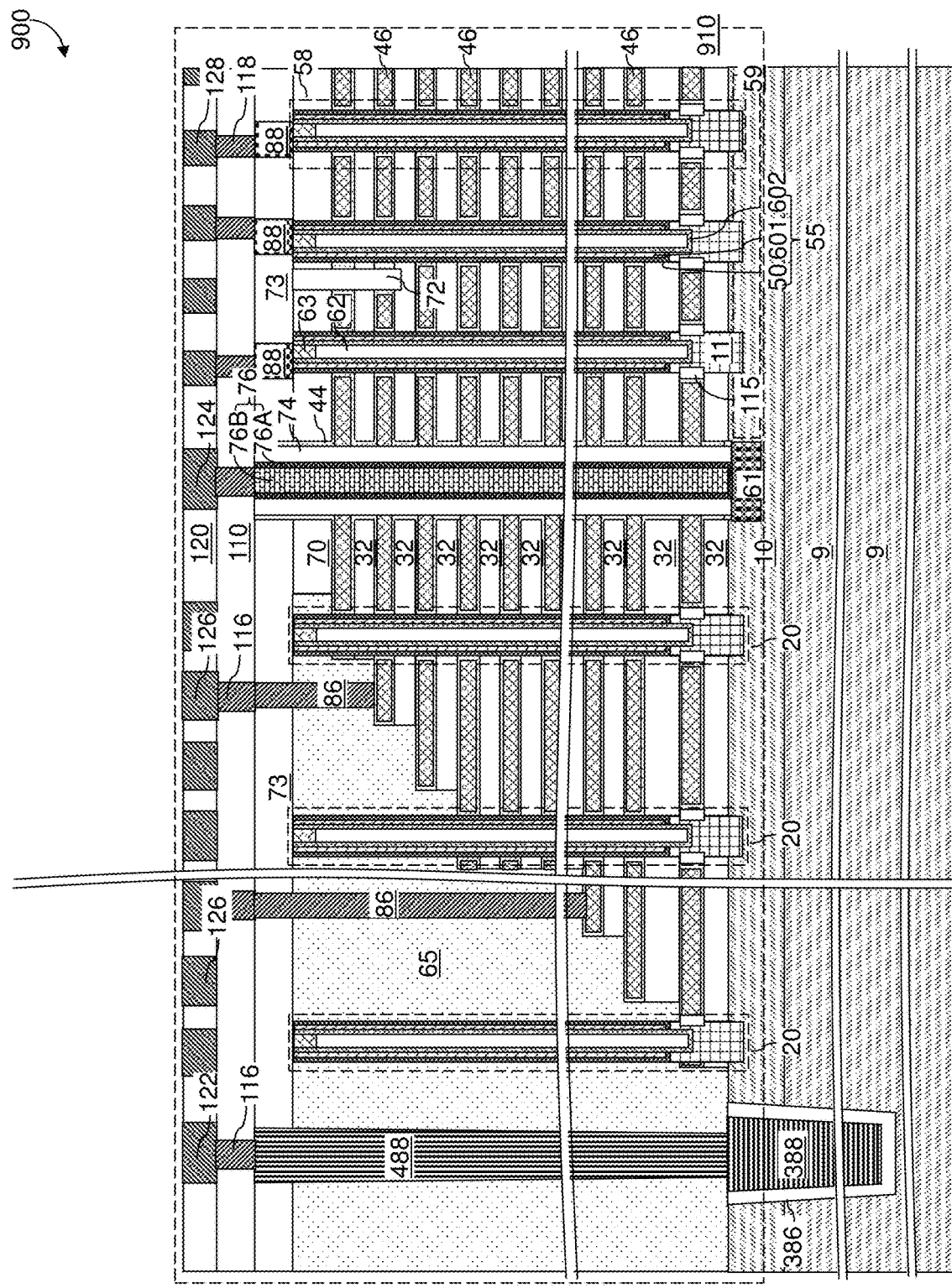
FIG. 4A is a vertical cross-sectional view of a region of the first semiconductor die after formation of first line-level metal interconnect structures according to an embodiment of the present disclosure.
Figure 4B:
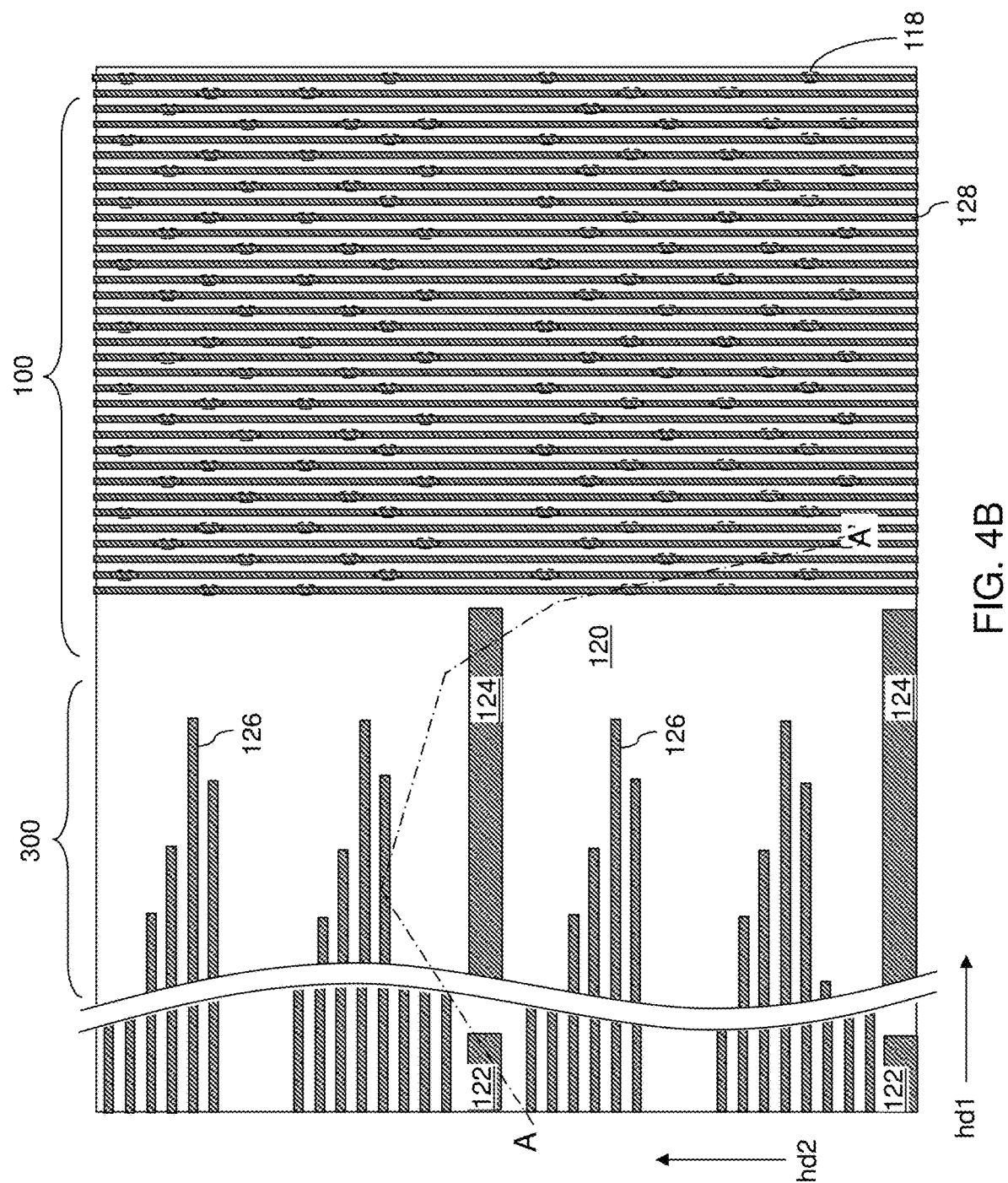
FIG. 4B is a top-down view of the region of the first semiconductor die of FIG. 4A.

Referring to FIGS. 4A and 4B, an upper contact-level dielectric layer 110 can be formed over the lower contact-level dielectric layer 73. Bit-line-connection via structures 118 can be formed through the upper contact-level dielectric layer 110 on a respective one of the drain contact via structures 88. Connection via structures 116 can be formed through the upper contact-level dielectric layer 110 on a respective one of the layer contact via structures 86 and the source contact structures 76. A first line-level dielectric layer 120 can be formed over the upper contact-level dielectric layer 110.

First metal lines (122, 124, 126, 128) are formed in the first line-level dielectric layer 120. The first metal lines (122, 124, 126, 128) can include power-and-control-signal lines 122 that electrically contact the through-memory-level connection via structures 488 through a respective structure 116. The first metal lines (122, 124, 126, 128) can include source-connection metal lines 124, which can be formed on a first subset of the connection via structures 116 that contacts a respective one of the source contact structures 76. In one embodiment, the source-connection metal lines 124 and the power-and-control-signal lines 122 may be electrically connected to each other or comprise the same lines. In another embodiment, the source-connection metal lines 124 and the power-and-control-signal lines 122 are not electrically connected to each other and comprise different lines. The first metal lines (122, 124, 126, 128) can include word-line-connection metal lines 126, which can be formed on a second subset of the connection via structures 116 that contacts a respective one of the layer contact via structures 86. The first metal lines (122, 124, 126, 128) can include bit lines 128 that contact a respective subset of the bit-line-connection via structures 118. The bit lines 128 can be formed throughout the memory array regions 100, and extend into the bit line hookup regions BLHU. The first metal lines (122, 124, 126, 128) can laterally extend along a first horizontal direction hd1 or along a second horizontal direction hd2 that is perpendicular to the first horizontal direction hd1. This forms a memory device 910, such as a three-dimensional memory device.

Figure 5A:
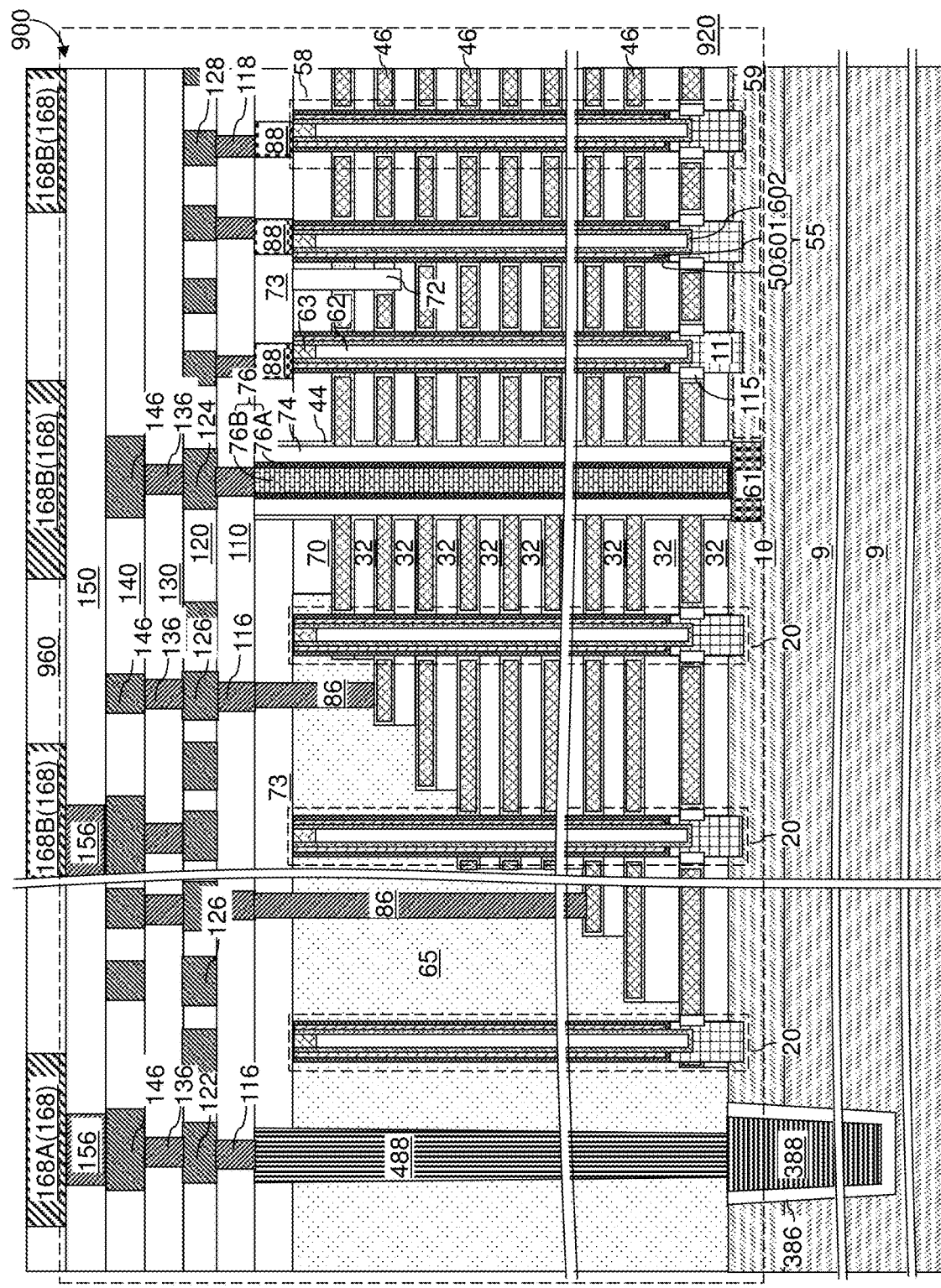
FIG. 5A is a vertical cross-sectional view of a region of the first semiconductor die after formation of first bonding pads according to an embodiment of the present disclosure.
Figure 5B:
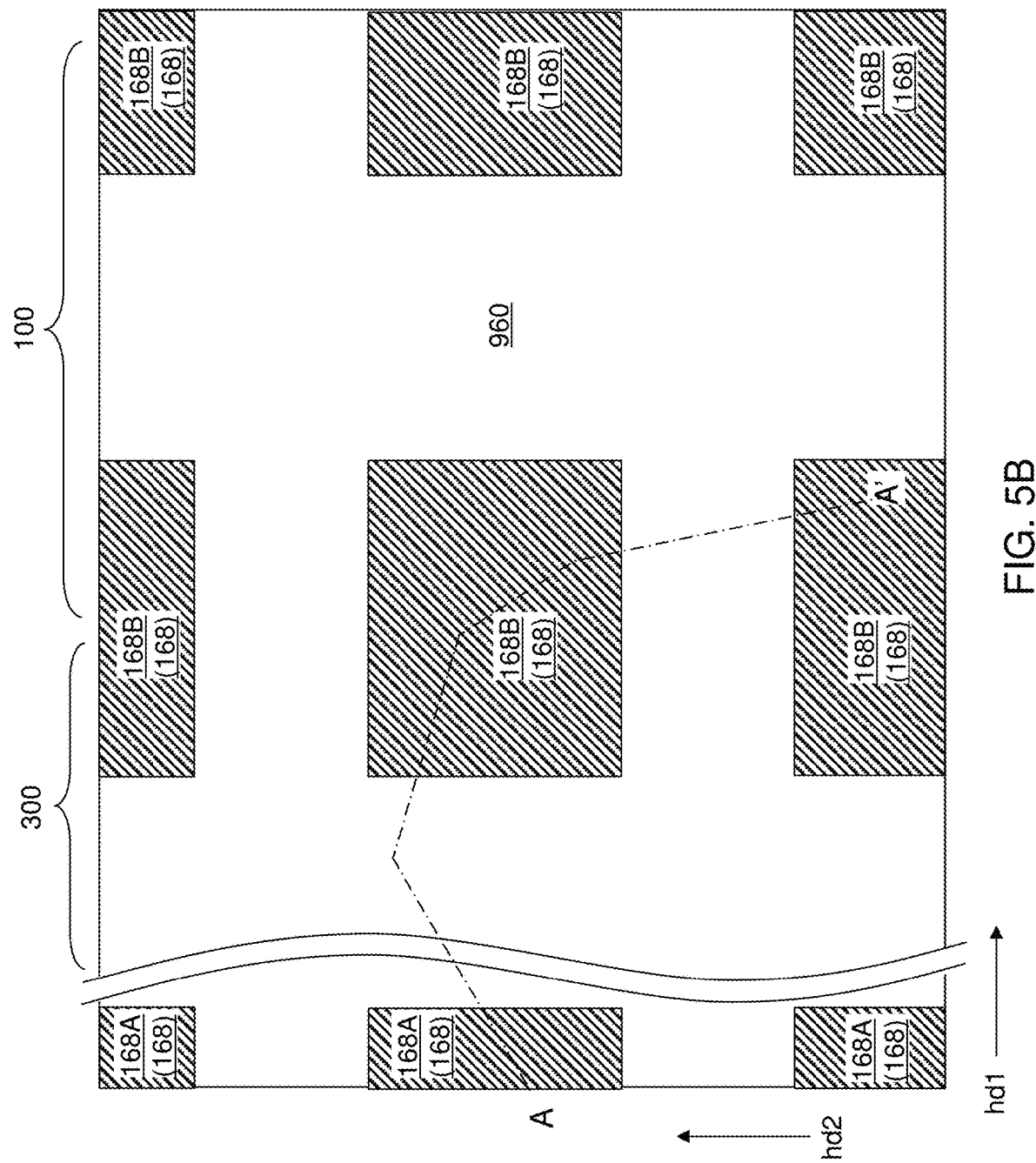
FIG. 5B is a top-down view of the region of the first semiconductor die of FIG. 5A.
Figure 5C:
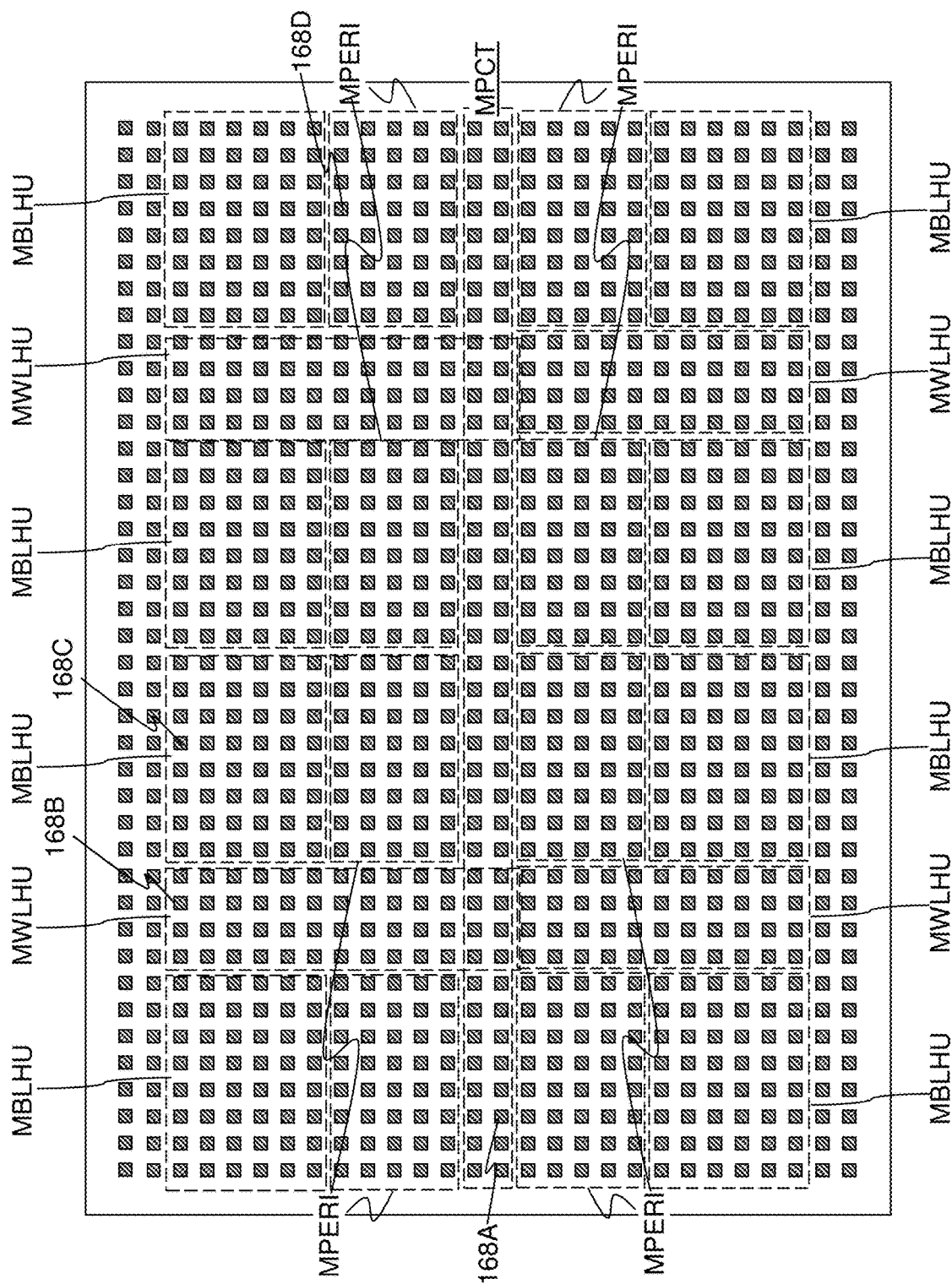
FIG. 5C is a top-down view of the first semiconductor die of FIGS. 5A and 5B.

Referring to FIGS. 5A-5C, a first via-level dielectric layer 130 can be formed over the first line-level dielectric layer 120. First conductive via structures 136 can be formed through the first via-level dielectric layer 130 on a respective one of the power-and-control-signal lines 122, the source-connection metal lines 124 and the word-line-connection metal lines 126.

A second line-level dielectric layer 140 can be formed over the first via-level dielectric layer 130. Second metal lines 146 can be formed in the second line-level dielectric layer 140 on a respective one of the first conductive via structures 136. A pad-via-level dielectric layer 150 can be formed over the second line-level dielectric layer 140. Pad-connection via structures 156 can be formed through the pad-via-level dielectric layer 150 on a respective one of the second metal lines 146.

Generally, first dielectric material layers embedding first metal interconnect structures can be formed over the first semiconductor devices of the first semiconductor die 900. The total number of levels of metal lines can be limited to two by routing the power distribution network and the control signal distribution network within the first semiconductor die 900 from the area of the power and control signal connection region PW_CTR, which is provided through the center portion of the first semiconductor die 900. In other words, the first metal lines (122, 124, 126, 128) and the second metal lines 146 can be employed to provide all horizontal signal and power routing throughout the three-dimensional memory device.

The set of all device components formed over the front surface of the first semiconductor substrate (9, 10), including the memory device 910 is herein referred to as a first device structure 920. A first pad-level dielectric layer 960 can be formed over the pad-via-level dielectric layer 150. First bonding pads 168 can be formed in the first pad-level dielectric layer 960 on a respective one of the pad-connection via structures 156.

As shown in FIG. 5C, the first bonding pads 168 include first power-and-control-signal-path bonding pads 168A which are electrically connected to global power control signal paths within the three-dimensional memory array. Optionally, the first power-and-control-signal-path bonding pads 168A may be electrically connected to the source regions 61 via elements 124 and 76 described above. The areas of the first power-and-control-signal-path bonding pads 168A are herein referred to as a memory-side power-and-control-signal-path bonding pad region MPCT, which overlaps with the area of the power and control signal connection region PW_CTR of the first semiconductor devices on the first semiconductor die 900.

The pitch of the first power-and-control-signal-path bonding pads 168A along the lengthwise direction of the memory-side power-and-control-signal-path bonding pad region MPCT can be the same as the pitch of the through-substrate via structures 388. In one embodiment, the pitch of the first power-and-control-signal-path bonding pads 168A along the lengthwise direction of the memory-side power-and-control-signal-path bonding pad region MPCT can be in range from 0.6 micron to 60 microns, such as from 1 microns to 20 microns.

The first bonding pads 168 include first word-line-hookup bonding pads 168B that are electrically connected to the word lines of the three-dimensional memory array, which comprise the electrically conductive layers 46. The areas of the first word-line-hookup bonding pads 168B are herein referred to as memory-side word-line-hookup bonding pad regions MWLHU, which generally overlaps with the area of a respective word line hookup region WLHU of the first semiconductor devices on the first semiconductor die 900.

The first bonding pads 168 include first bit-line-hookup bonding pads 168C that are electrically connected to the bit lines 128 of the three-dimensional memory array. The areas of the first bit-line-hookup bonding pads 168C are herein referred to as memory-side bit-line-hookup bonding pad regions MBLHU, which generally overlaps with the area of a respective bit line hookup region BLHU of the first semiconductor devices on the first semiconductor die 900.

The first bonding pads 168 include first peripheral connection bonding pads 168D that are electrically connected to other electrical nodes of the three-dimensional memory array. The areas of the first peripheral connection bonding pads 168D are herein referred to as memory-side peripheral connection bonding pad regions MPERI, which generally overlaps with the area of a respective memory array region ARRAY of the first semiconductor devices on the first semiconductor die 900.

The first bonding pads 168 may be arranged as a periodic two-dimensional array, such as a periodic two-dimensional periodic array. In one embodiment, the pitch of the first bonding pads 168 along each repetition direction can be in a range from 0.6 microns to 60 microns, such as from 1 microns to 20 microns. In a non-limiting illustrative example, the first bonding pads 168 may have a square horizontal shape, and the dimension of each side of a first bonding pad 168 may be in a range from 0.3 micron to 30 microns, such as from 0.5 microns to 10 microns.

Figure 6A:
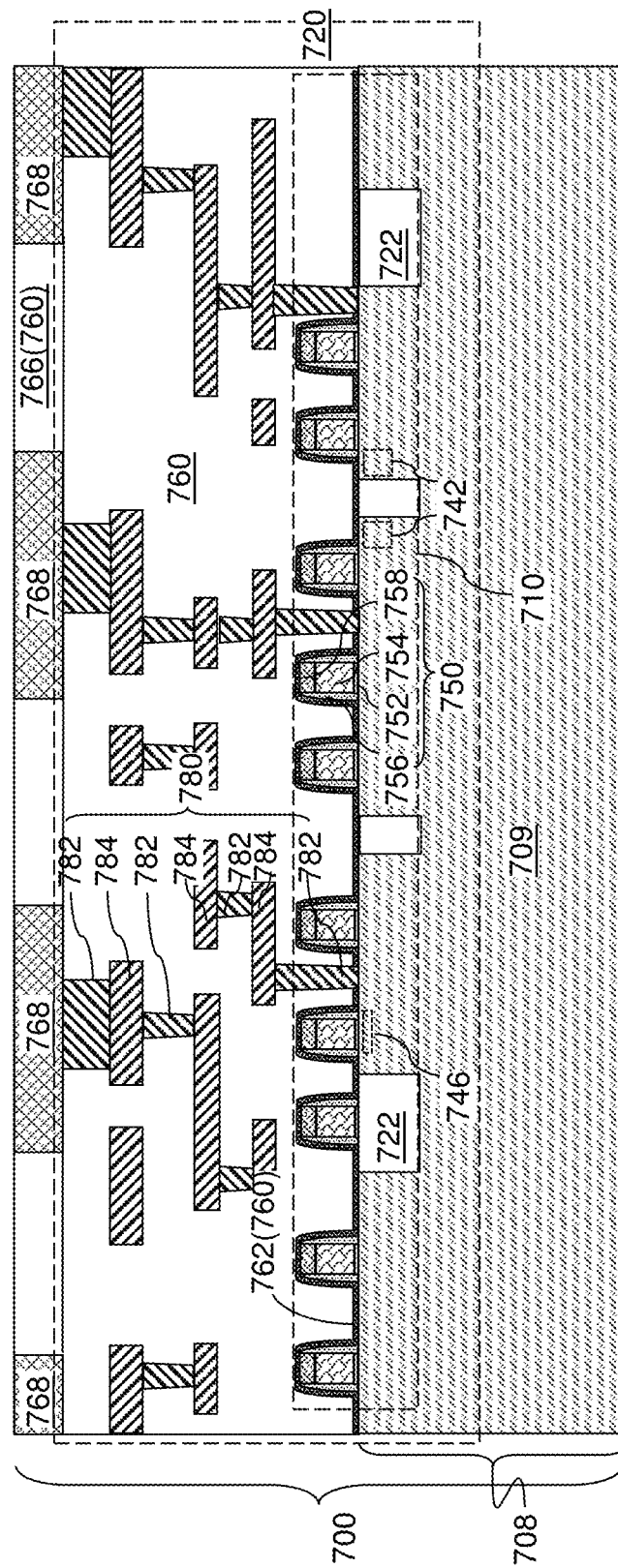
FIG. 6A is a vertical cross-sectional view of a region of a second semiconductor die according to an embodiment of the present disclosure.
Figure 6B:
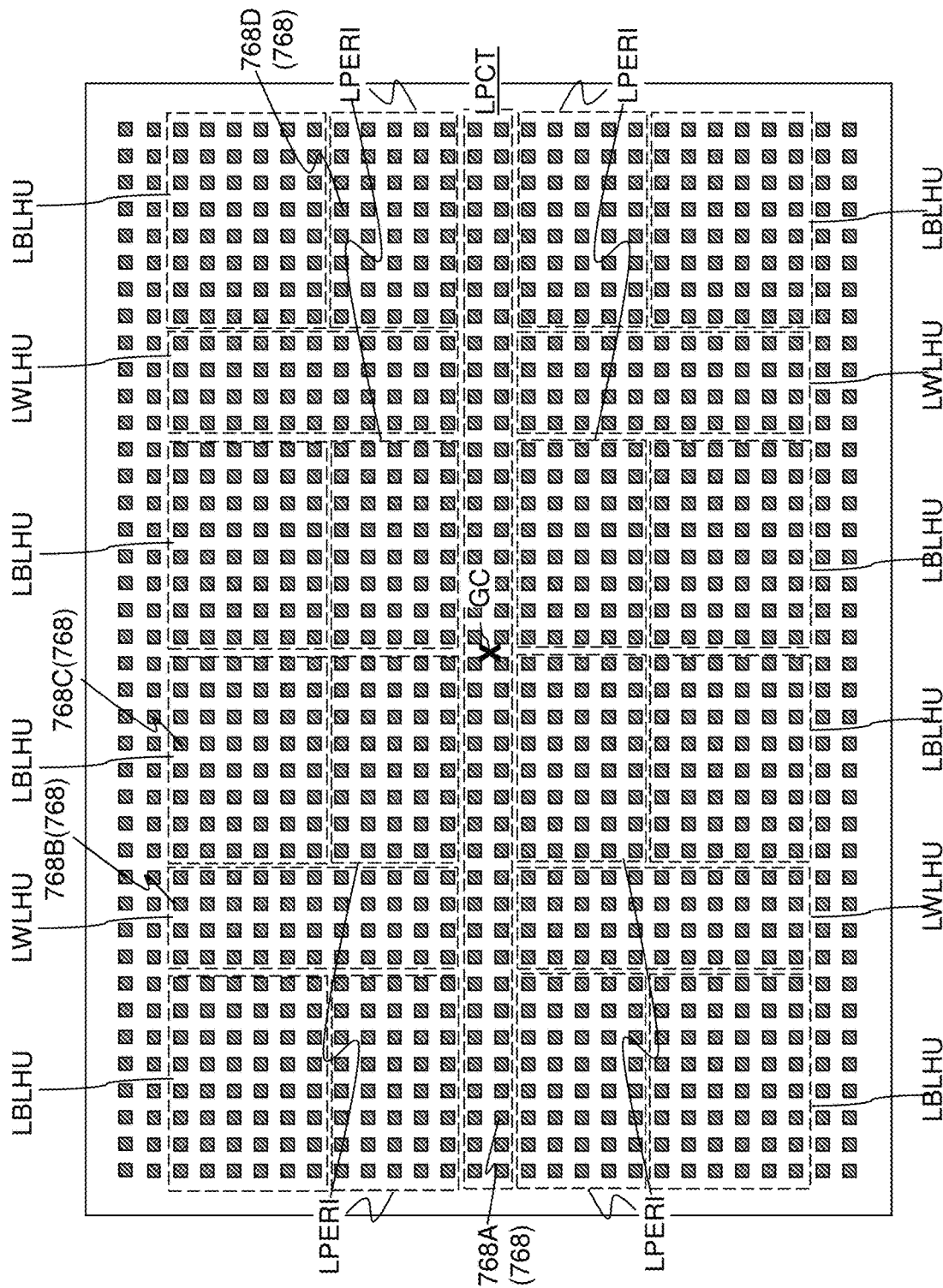
FIG. 6B is a top-down view of the second semiconductor die of FIG. 6B.

Referring to FIGS. 6A and 6B, a second semiconductor die 700 according to an embodiment of the present disclosure is illustrated. The second semiconductor die 700 comprises a second semiconductor substrate 708, which includes a second substrate semiconductor layer 709. The second semiconductor die 700 includes a second device structure 720 including second semiconductor devices 710 and second metal interconnect structures 780 embedded in second dielectric material layers 760. The second semiconductor devices 710 can be formed on the top surface of the second substrate semiconductor layer 709. In one embodiment, the second semiconductor devices 710 can include CMOS devices (e.g., transistors in a CMOS configuration) that make up a control circuit for controlling operation of the three-dimensional memory array within the first semiconductor die 900. The second metal interconnect structures 780 provide electrical interconnection between the various nodes of the second semiconductor devices 710.

For example, shallow trench isolation structures 722 can be formed on the top surface (i.e., the front surface) of the second semiconductor substrate 708. Gate stack structures 750 can be formed over the top surface of the second semiconductor substrate 708. Each gate stack structure 750 can include, for example, a gate dielectric 752, a gate electrode 754, a dielectric gate cap 758, and a gate spacer 756. Active regions 742 can be formed in upper portions of the second substrate semiconductor layer 709 that are not masked by the gate stack structures 750. The second metal interconnect structures 780 comprises various metal lines 784 and various connection via structures 782. The second dielectric material layers 760 include various dielectric material layers located at different levels. The second dielectric material layers 760 may include a dielectric diffusion barrier 762 such as a silicon nitride layer. A topmost layer of the second dielectric material layers 760 may be a second pad-level dielectric layer 766.

Second bonding pads 768 can be formed in the second pad-level dielectric layer 766. The second bonding pads 768 include second power-and-control-signal-path bonding pads 768A that are electrically connected to control circuits configured to generate global control signal paths within the second semiconductor devices 710. The second power-and-control-signal-path bonding pads 768A may also be optionally electrically connected to a power supply circuit for the source regions 61 of the three-dimensional memory device.

The areas of the second power-and-control-signal-path bonding pads 768A are herein referred to as a logic-side power-and-control-signal-path bonding pad region LPCT, as shown in FIG. 6B. The second power-and-control-signal-path bonding pads 768A can be arranged in a mirror image pattern of the pattern of the first power-and-control-signal-path bonding pads 168A of the first semiconductor die 900.

The second bonding pads 768 include second word-line-hookup bonding pads 768B that are electrically connected to the word line control circuit (e.g., word line switching devices) of the second semiconductor devices 710. The areas of the second word-line-hookup bonding pads 768B are herein referred to as logic-side word-line-hookup bonding pad regions LWLHU. The second word-line-hookup bonding pads 768B can be arranged in a mirror image pattern of the pattern of the first word-line-hookup bonding pads 168B of the first semiconductor die 900.

The second bonding pads 768 include second bit-line-hookup bonding pads 768C that are electrically connected to the bit line control circuit and the sense amplifier circuits within the second semiconductor devices 710. The bit line control circuit may include one or more of bit line driver circuits, latch circuit that functions as a cache memory of the NAND flash device, and column direction logic control circuits. The areas of the second bit-line-hookup bonding pads 768C are herein referred to as logic-side bit-line-hookup bonding pad regions MBLHU. The second bit-line-hookup bonding pads 768C can be arranged in a mirror image pattern of the pattern of the first bit-line-hookup bonding pads 168C of the first semiconductor die 900.

The second bonding pads 768 include second peripheral connection bonding pads 768D that are electrically connected to a peripheral device control circuit located in the second semiconductor devices 710. The peripheral device control circuit may include one or more of source power supply circuits (also referred to as shunt circuits), well bias voltage supply circuits, word line decoder circuits, and other miscellaneous circuits. The areas of the second peripheral connection bonding pads 768D are herein referred to as logic-side peripheral connection bonding pad regions LPERI, which are located over the peripheral control circuit region in the second semiconductor die 700. The second peripheral connection bonding pads 768D can be arranged in a mirror image pattern of the pattern of the first peripheral connection bonding pads 168D of the first semiconductor die 900.

The second bonding pads 768 may be arranged as a periodic two-dimensional array, such as a periodic two-dimensional periodic array. The pattern of the second bonding pads 768 can be a mirror image pattern of the pattern of the first bonding pads 168. In one embodiment, the geometrical center GC of the second semiconductor die 700 can be located within the area of the logic-side power-and-control-signal-path bonding pad region LPCT.

Figure 7:
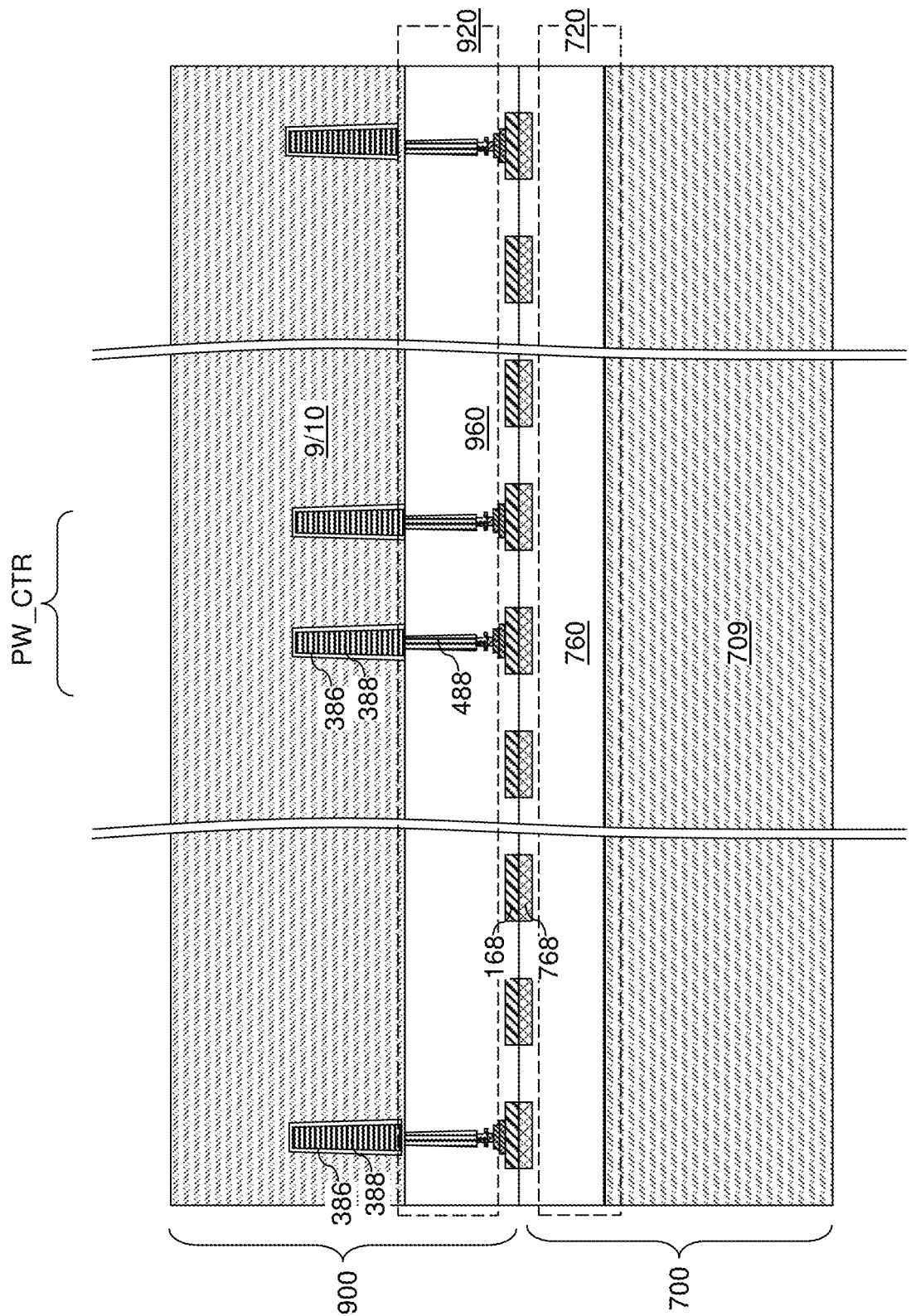
FIG. 7 is a vertical cross-sectional view of an exemplary structure after bonding the second semiconductor die to the first semiconductor die according to an embodiment of the present disclosure.

Referring to FIG. 7, the second semiconductor die 700 can be bonded to the first semiconductor die 900 such that the front surface of the first semiconductor substrate (9, 10) is more proximal to the second semiconductor die 700 than a backside surface of the first semiconductor substrate (9, 10) is to the second semiconductor die 700. For example, the second semiconductor die 700 can be positioned such that the second bonding pads 768 face a respective one of the first bonding pads 168. The second bonding pads 768 are brought into contact with a respective one of the first bonding pads 168. In case the first pad-level dielectric layer and the second pad-level dielectric layer include silicon oxide, oxide-to-oxide bonding can be induced at an elevated temperature in a range from 200 degrees Celsius to 300 degrees Celsius. The first pad-level dielectric layer can be bonded to the second pad-level dielectric layer. Metal-to-metal bonding can be induced between each mating pair of a first bonding pad 168 and a second bonding pad 768 by performing an anneal process at another elevated temperature. For example, if the first bonding pads 168 and the second bonding pads 768 include copper, copper-to-copper bonding can be induced between each mating pair of a first bonding pad 168 and a second bonding pad 768 by performing an anneal process at an elevated temperature in a range from 300 degrees Celsius to 450 degrees Celsius.

Generally, a wafer-to-wafer bonding process may be employed to bond a first wafer including a plurality of first semiconductor dies 900 to a second wafer including a plurality of second semiconductor dies 700. In this case, multiple bonded pairs of a first semiconductor die 900 and a second semiconductor die 700 can be simultaneously formed by bonding the first wafer to the second wafer.

Figure 8:
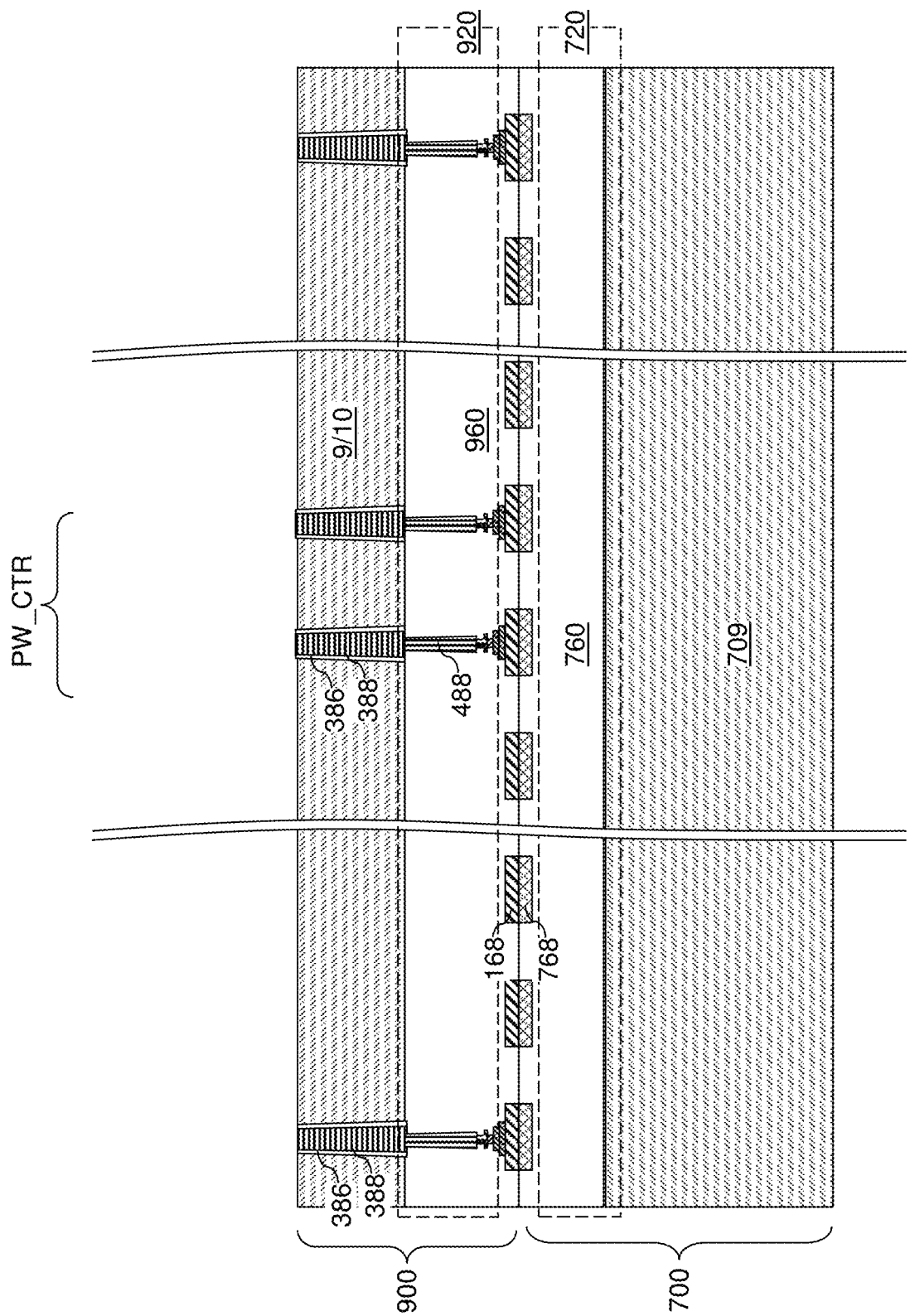
FIG. 8 is a vertical cross-sectional view of the exemplary structure after thinning the first semiconductor die according to an embodiment of the present disclosure.

Referring to FIG. 8, the first semiconductor substrate (9, 10) can be thinned by removing the material of the first semiconductor substrate (9, 10) from the backside surface. For example, grinding, polishing, an anisotropic etch process, and/or an isotropic etch process can be performed to remove the material of the first semiconductor substrate (9, 10) from the backside surface. The first semiconductor substrate (9, 10) can be thinned until surfaces of the through-substrate via structures 388 are physically exposed on the backside surface of the thinned first semiconductor substrate (9, 10). Horizontal surfaces of the through-substrate dielectric liners 386 can be removed during the thinning of the first semiconductor substrate (9, 10). Each remaining portion of the through-substrate dielectric liners 386 can have a tubular configuration. Each through-substrate via structure 388 is laterally surrounded by a respective one of the through-substrate dielectric liners 386, and vertically extends through the first semiconductor substrate (9, 10) as thinned by the thinning process. As such, the through-substrate via structures 388 can have the same thickness as the first semiconductor substrate (9, 10) as thinned by the thinning process. The thickness of the first semiconductor substrate (9, 10) after the thinning process can be in a range from 5 microns to 20 microns, although lesser and greater thicknesses can also be employed. Each through-substrate via structure 388 can have a physically exposed planar surface that is physically exposed on the backside surface of the first semiconductor substrate (9, 10).

Figure 9:
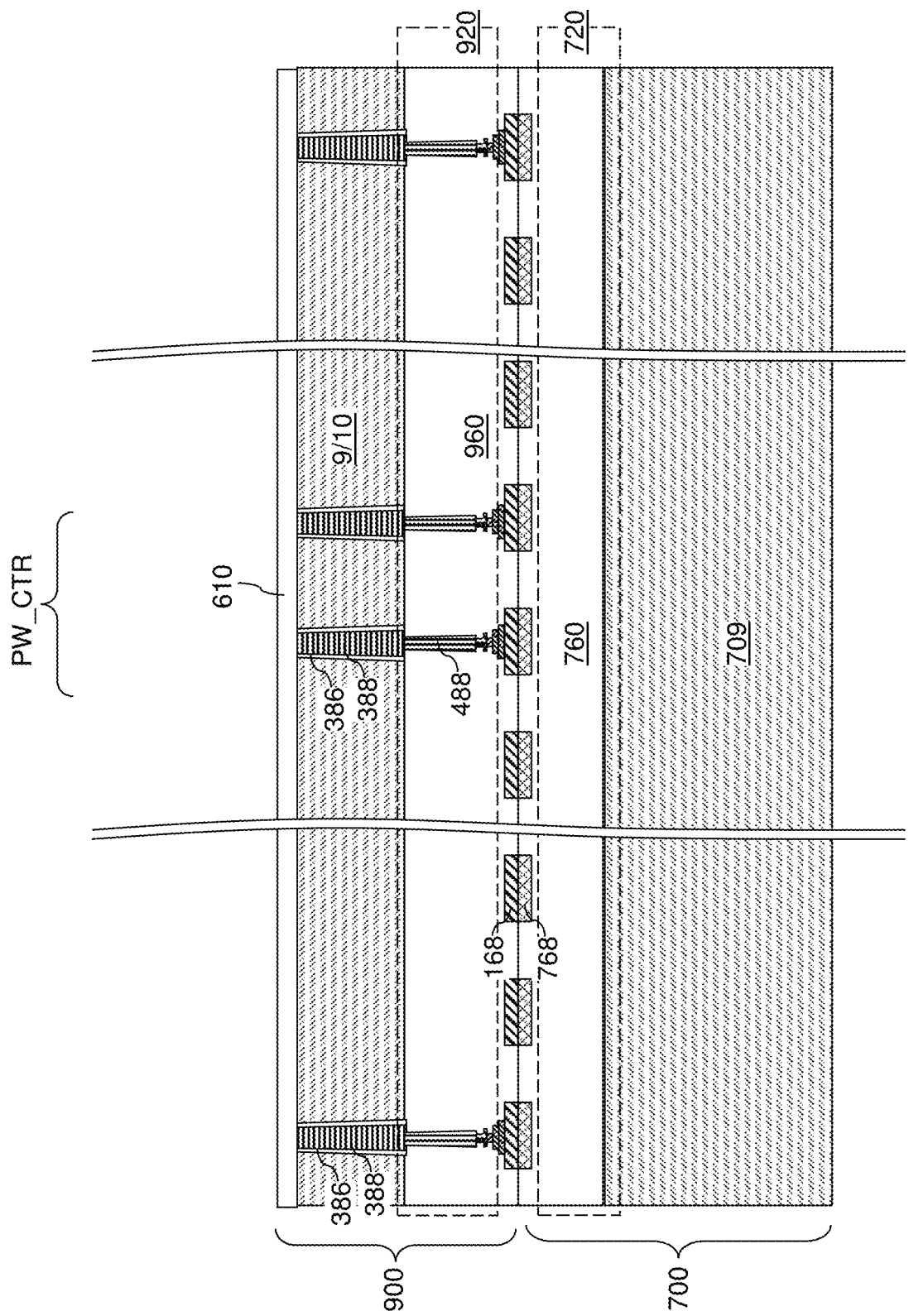
FIG. 9 is a vertical cross-sectional view of the exemplary structure after formation of a first backside dielectric layer according to an embodiment of the present disclosure.

Referring to FIG. 9, a first backside dielectric layer 610 can be formed on the backside surface of the first semiconductor substrate (9, 10). The first backside dielectric layer 610 includes a dielectric material such as silicon oxide, and can have a thickness in a range from 100 nm to 500 nm, although lesser and greater thicknesses can also be employed.

Figure 10A:
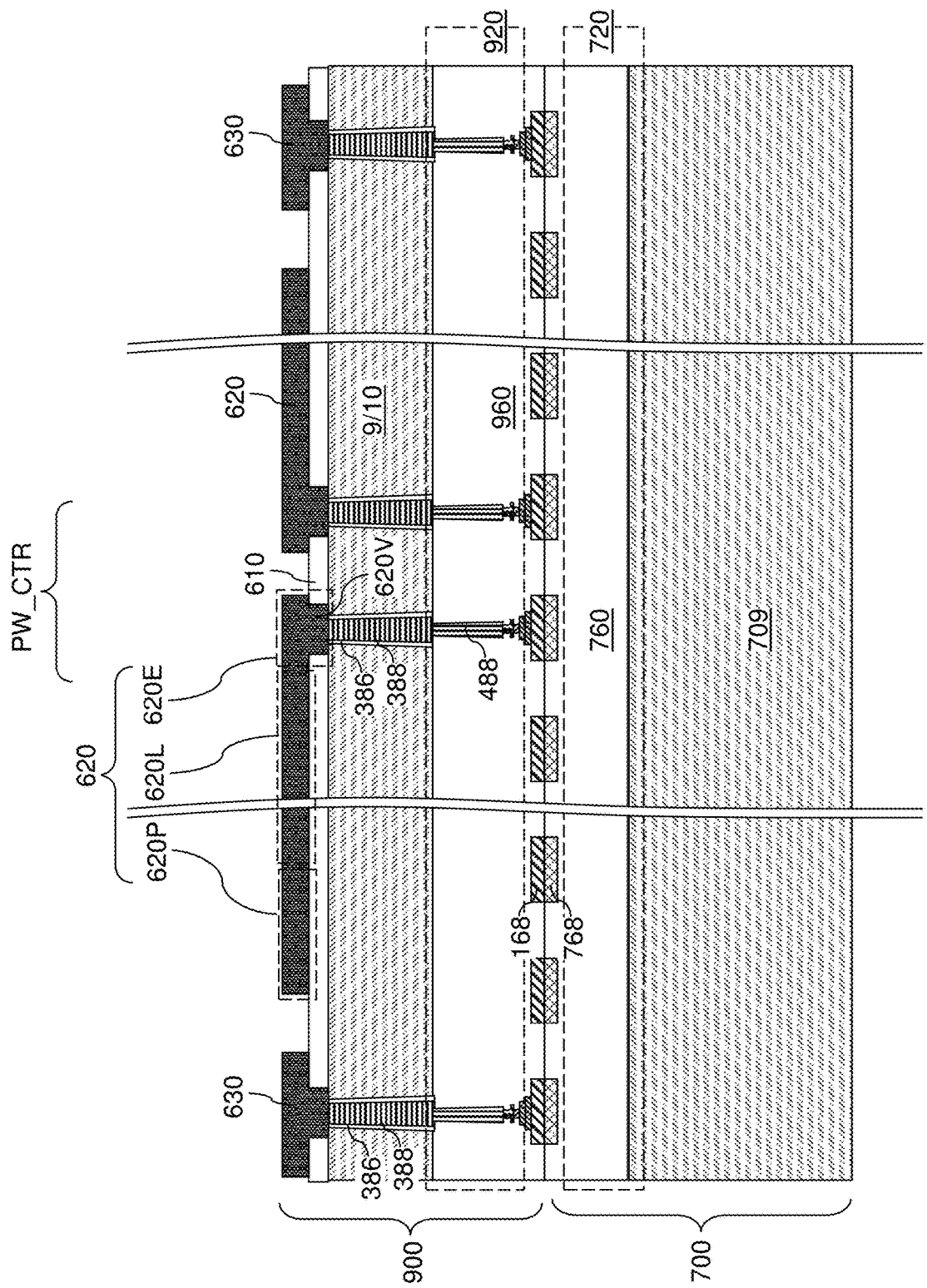
FIG. 10A is a vertical cross-sectional view of the exemplary structure formation of integrated line and pad structures according to an embodiment of the present disclosure.
Figure 10B:
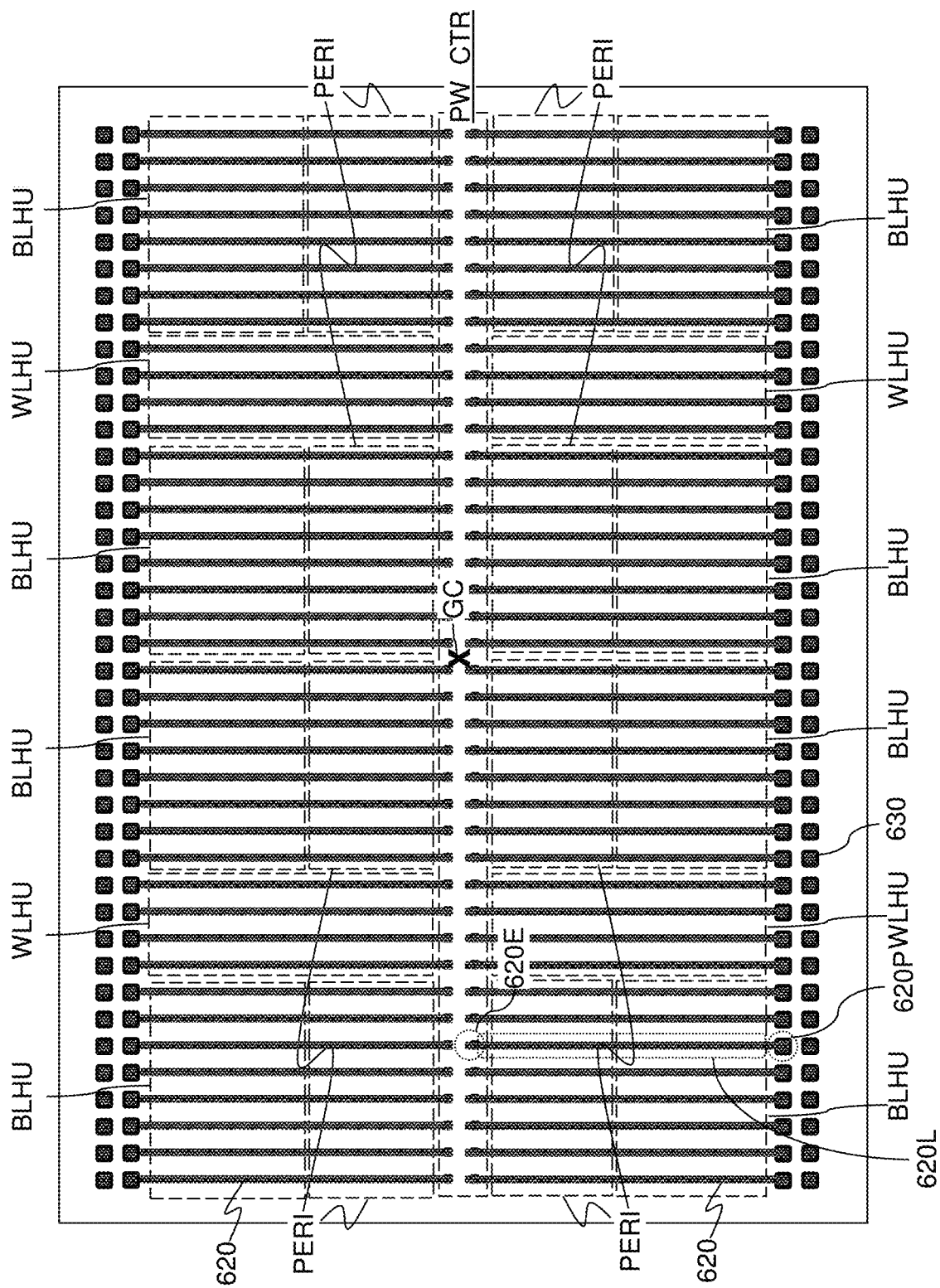
FIG. 10B is a plan view of the backside of the first semiconductor die at the processing steps of FIG. 10A.

Referring to FIGS. 10A-10B, via openings can be formed above each through-substrate via structure 388 in the first semiconductor substrate (9, 10) through the first backside dielectric layer 610. For example, a photoresist layer (not shown) can be applied over the first backside dielectric layer 610, and can be lithographically patterned to form openings over the areas of the through-substrate via structures 388. The pattern of the openings in the photoresist layer can be transferred through the first backside dielectric layer 610 by an etch process, which may include an anisotropic etch process (such as a reactive ion etch process) or an isotropic etch process (such as a wet etch process). The photoresist layer can be subsequently removed, for example, by ashing.

In one embodiment, openings through the first backside dielectric layer 610 can be formed over each through-substrate via structure 388 within the power and control signal connection region PW_CTR. Further, additional openings can be formed through the first backside dielectric layer 610 over each through-substrate via structure 388 located in the memory array regions ARRAY, the bit line hook-up regions BLHU, and/or the word line hook-up regions WLHU. In one embodiment, additional through-substrate via structures 388 are located within the first semiconductor substrate (9, 10) along edges of the first semiconductor die 900 within areas in which external bonding pads to be subsequently formed. An opening through the first backside dielectric layer 610 can be formed over each of such additional through-substrate via structures 388. Horizontal surfaces of the through-substrate via structures 388 can be physically exposed underneath each opening through the first backside dielectric layer 610.

At least one metallic material can be deposited into the openings through the first backside dielectric layer 610 and over the planar surface of the first backside dielectric layer 610 to form a metallic material layer. The at least one metallic material can include copper, aluminum, ruthenium, cobalt, molybdenum, and/or any other metallic material that may be deposited by physical vapor deposition, chemical vapor deposition, electroplating, vacuum evaporation, or other deposition methods. For example, a metallic nitride liner material (such as TiN, TaN, or WN) may be deposited directly on the physically exposed surfaces of the through-substrate via structures 388, on sidewalls of the openings through the first backside dielectric layer 610, and over the physically exposed planar surface of the first backside dielectric layer 610. The thickness of the metallic nitride liner material can be in a range from 10 nm to 100 nm, although lesser and greater thicknesses can also be employed. At least one metallic fill material such as copper or aluminum can be deposited over the metallic nitride liner material. In one embodiment, the at least one metallic fill material can include a stack of a high-electrical-conductivity metal layer (such as a copper layer or an aluminum layer) and an underbump metallurgy (UBM) layer stack for bonding a solder ball thereupon. Exemplary UBM layer stacks include, but are not limited to, an Al/Ni/Au stack, an Al/Ni/Cu stack, a Cu/Ni/Au stack, a Cu/Ni/Pd stack, a Ti/Ni/Au stack, a Ti/Cu/Ni/Au stack, a Ti—W/Cu stack, a Cr/Cu stack, and a Cr/Cu/Ni stack. The thickness of the metallic material layer over the planar horizontal surface of the first backside dielectric layer 610 can be in a range from 0.5 microns to 10 microns, such as from 1 micron to 5 microns, although lesser and greater thicknesses can also be employed.

A photoresist layer can be applied over the metallic material layer, and can be lithographically patterned to form a pattern of conductive paths extending from a respective one of the through-substrate via structures 388 located within the power and control signal connection region PW_CTR to a region in which external bonding pads and solder balls are to be subsequently formed. The external bonding pads can be arranged in a row or in multiple rows adjacent to an edge of the first semiconductor die 900. In one embodiment, the through-substrate via structures 388 located within the power and control signal connection region PW_CTR can be arranged along a direction parallel to lengthwise edges of the first semiconductor die 900, and the external bonding pads can be subsequently formed in rows that are adjacent to, and are parallel to, the lengthwise edges of the first semiconductor die 900. In this case, the pattern of the conductive paths can be a pattern of linear strips that extend between the power and control signal connection region PW_CTR and a respective lengthwise edge of the first semiconductor die 900 along a direction that is perpendicular to the lengthwise edges of the first semiconductor die 900.

The pattern in the photoresist layer can be transferred through the metallic material layer employing an etch process, which can include an anisotropic etch process and/or an isotropic etch process. The etch process employs the patterned photoresist layer as an etch mask, and etches unmasked portions of the metallic material layer selective to the material of the first backside dielectric layer 610.

Patterned portions of the metallic material layer that remain after the etch process comprise integrated line and pad structures 620. Each integrated line and pad structures 620 can be formed on a respective one of the through-substrate via structures 388 located within the power and control signal connection region PW_CTR. Each integrated line and pad structure 620 can include a via portion 620V that extends through a respective opening through the first backside dielectric layer 610 and contacts a respective through-substrate via structure 388. Each integrated line and pad structure 620 can include a pad portion 620P located adjacent to an edge of the first semiconductor die 900. For example, the pad portions 620P can be located along lengthwise edges of the first semiconductor die 900. The lateral offset distance between the lengthwise edges of the first semiconductor die 900 and the pad portions 620P may be in a range from 0.5% to 25%, such as from 2% to 15%, of the width of the first semiconductor die 900 (i.e., the dimension of the first semiconductor die 900 along the widthwise direction that is perpendicular to the lengthwise direction). Each pad portion 620P can be located in the edge portion which is more proximal to a periphery of the backside surface of the first semiconductor substrate (9, 10) than to a geometrical center GC of the backside surface of the first semiconductor substrate (9, 10).

Each integrated line and pad structure 620 can include a line portion 620L that connects the via portion 620V and the pad portion 620P. The via portion 620V may comprise a bottom part of an end portion 620E of the line portion 620L. In one embodiment, the line portions 620L of the integrated line and pad structures 620 can laterally extend along the widthwise direction of the first semiconductor die 900, and can be parallel to each other. The length of each line portion 620 may be at least 25% of the width of the first semiconductor die 900, and can be in a range from 25% to 50%, such as from 30% to 45%, of the width of the first semiconductor die 900.

Each of the through-substrate via structures 388 located in the power and control signal connection region PW_CTR electrically connects a respective one of the first metal interconnect structures in the first device structure 920 to the distal end region 620E of the line portion 620L of a respective one of the integrated line and pad structures 620. The through-substrate via structures 388 located in the power and control signal connection region PW_CTR are herein referred to as first through-substrate via structures 388.

In one embodiment, additional through-substrate via structures 388 can vertically extend through the first semiconductor substrate (9, 10). The additional through-substrate via structures 388 are herein referred to as first through-substrate via structures. The additional through-substrate via structures 388 can be located adjacent to the periphery of the backside surface of the first semiconductor substrate (9, 10).

For example, the additional through-substrate via structures 388 can be arranged in rows that laterally extend along the lengthwise direction of the first semiconductor die 900 adjacent to a respective lengthwise edge of the first semiconductor die 900.

Patterned portions of the metallic material layer that remain after the etch process can comprise pad structures 630 located on, and extending through, the first backside dielectric layer 610 and contacting a respective one of the additional through-substrate via structures 388. The pad structures 630 can be laterally spaced farther away from the geometrical center GC of the backside of the first semiconductor substrate (9, 10) than the pad portions 620P of the integrated line and pad structures 620 are from the geometrical center GC. In an illustrative example, the pad structures 630 can be arranged in rows that laterally extend along the lengthwise direction of the first semiconductor die 900, and can be more proximal to one of the lengthwise edges of the first semiconductor die 900 than the rows of the pad portions 620P of the integrated line and pad structures 620 are to the lengthwise edges of the first semiconductor die 900.

In one embodiment, the integrated line and pad structures 620 can have a uniform thickness within areas of the pad portions 620P and areas of line portions 620L that do not overlie any of the through-substrate via structures 388. In one embodiment, the distal end region 620E of each line portion 620L can comprise a via portion 620V that protrudes toward the first semiconductor substrate through the first backside dielectric layer and contacts a respective one of the first through-substrate via structures.

In one embodiment, the line portions 620L have a first width, and the pad portions 620P have a second width that is at least twice the first width. The lengthwise directions of the line portions 620L of the integrated line and pad structures 620 can be parallel to each other. A subset of, or all of, the through-substrate via structures 388 can be electrically connected to a respective one of the second semiconductor devices in the second device structure 720 through a bonded pair of a respective one of the first bonding pads 168 and a respective one of the second bonding pads 768.

Figure 11:
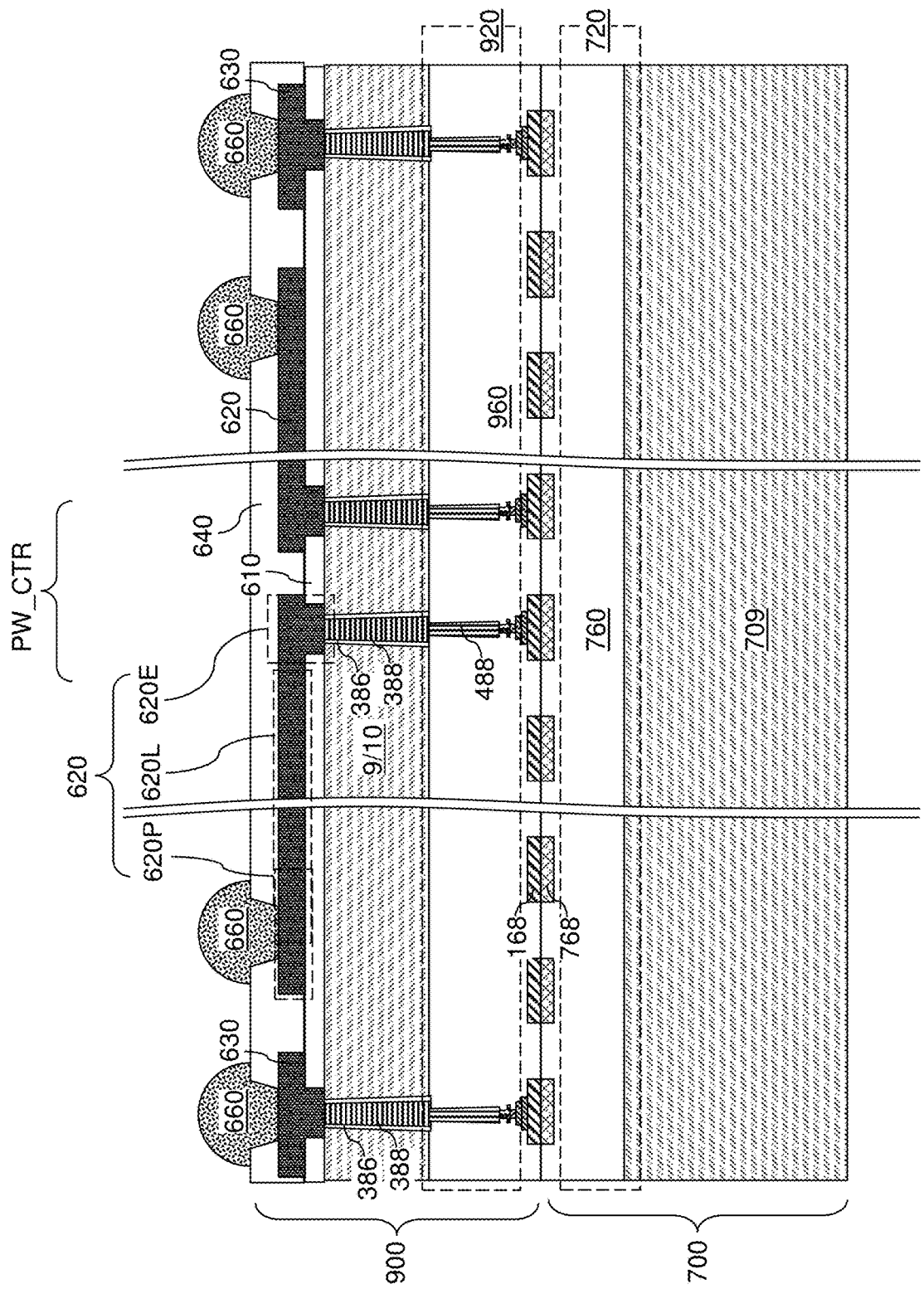
FIG. 11 is a vertical cross-sectional view of the exemplary structure after formation of solder material portions according to an embodiment of the present disclosure.

Referring to FIG. 11, a second backside dielectric layer 640 can be optionally formed over the integrated line and pad structures 620, the pad structures 630, and the first backside dielectric layer 610. The second backside dielectric layer 640 includes a dielectric material such as silicon nitride. The second backside dielectric layer 640 can function as a passivation layer that protects the first semiconductor substrate (9, 10) from ingress of moisture and/or contaminants. The thickness of the second backside dielectric layer 640 can be in a range from 50 nm to 500 nm, although lesser and greater thicknesses can also be employed.

A photoresist layer can be applied over the second backside dielectric layer 640, and can be lithographically patterned to form openings in areas that overlie the pad portions 620P of the integrated line and pad structures 620 or the pad structures 630. An etch process can be performed to etch unmasked portions of the second backside dielectric layer 640, thereby forming openings that extend to a top surface of a respective one of the pad portions 620P of the integrated line and pad structures 620 or the pad structures 630. The photoresist layer can be subsequently removed, for example, by ashing.

Solder material portions (e.g., solder bumps) 660 can be formed on the physically exposed top surfaces of the pad portions 620P of the integrated line and pad structures 620 or the pad structures 630. Each solder material portion 660 can fill a respective opening through the second backside dielectric layer 640, and can contact a top surface of a respective one of the pad portions 620P of the integrated line and pad structures 620 or the pad structures 630. The solder material portions 660 includes a solder material, which can include tin or a tin alloy, such as an alloy of tin, silver, and copper. For example, a tin alloy including 3%-4% of silver, 0.5%-0.7% of copper, and including tin as the balance can be employed for the solder material portions 660.

Figure 12:
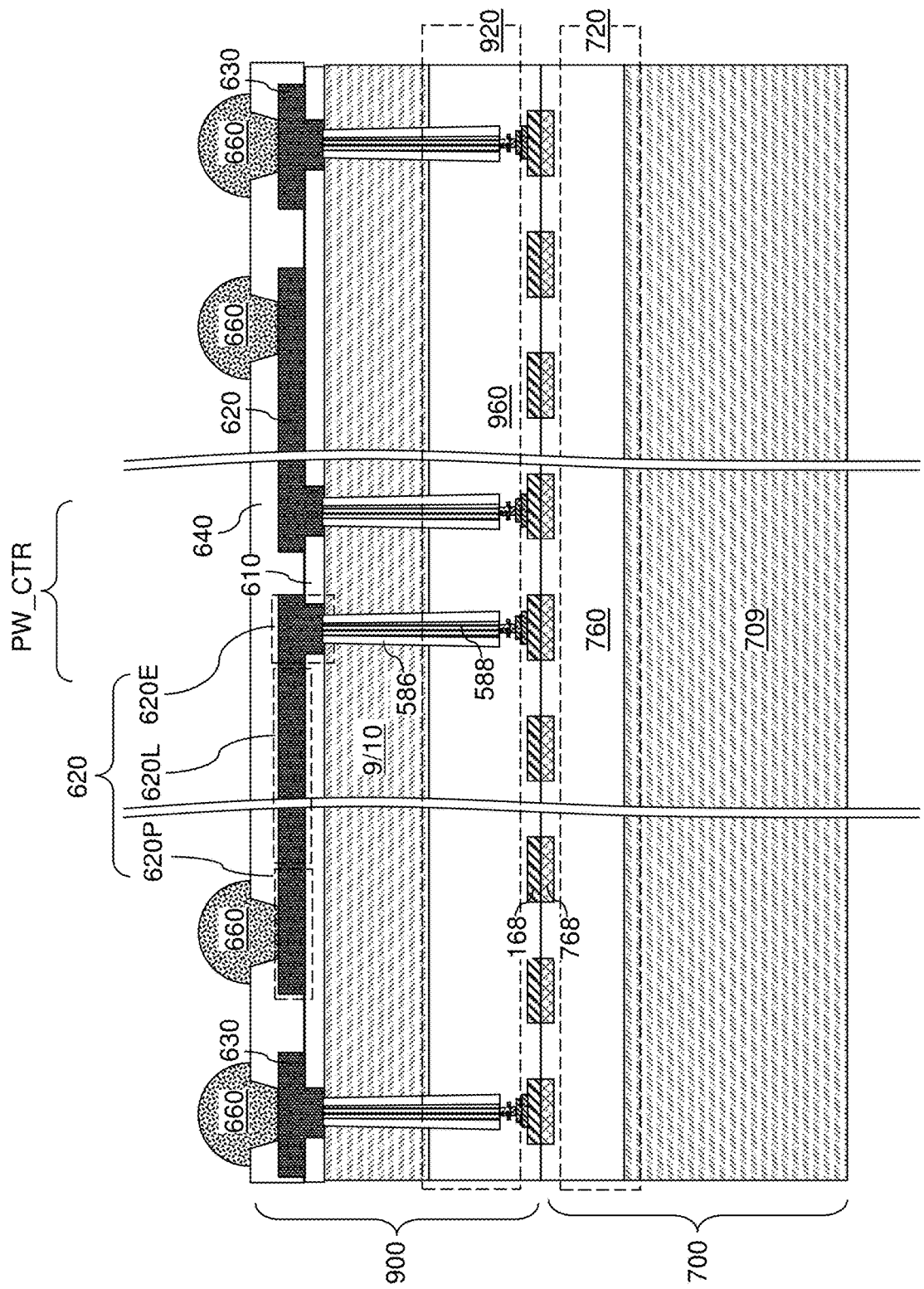
FIG. 12 is a vertical cross-sectional view of a first alternative configuration of the exemplary structure after formation of solder material portions according to an embodiment of the present disclosure.

Referring to FIG. 12, a first alternative configuration of the exemplary structure is illustrated, which can be derived from the exemplary structure by forming combinations of a through-substrate via structure 588 and a through-substrate dielectric liner 586 through a region of the first device structure 920 and through the first semiconductor substrate (9, 10). In this case, the through-substrate via structures 588 and the through-substrate dielectric liners 586 can be formed after formation of at least one dielectric material portion within the first device structure 920. For example, deep trenches can be formed through a retro-stepped dielectric material portion 65 and into the first semiconductor substrate (9, 10) after the processing steps of FIG. 2. The deep trenches can be filled with a dielectric liner and at least one conductive fill material to form the through-substrate via structures 588 and the through-substrate dielectric liners 586. Planar surfaces of the through-substrate via structures 588 and the through-substrate dielectric liners 586 can be subsequently physically exposed by thinning the backside of the first semiconductor substrate (9, 10). In effect, each combination of a through-substrate via structure 388, a through-substrate dielectric liner 386, and a through-memory-level via structure 488 can be replaced with a combination of a through-substrate via structures 588 and a through-substrate dielectric liner 586.

Figure 13:
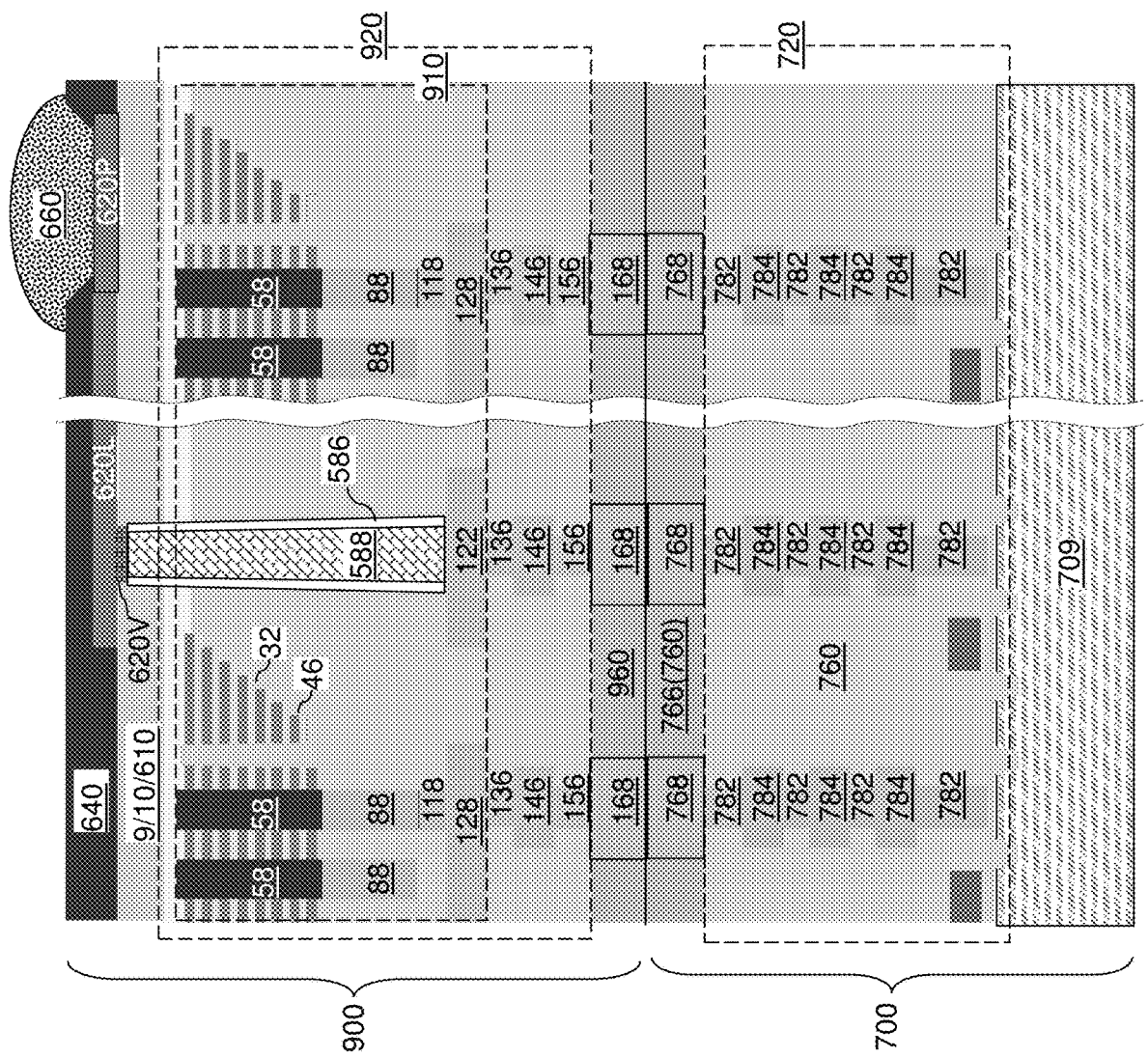
FIG. 13 is a vertical cross-sectional view of a second alternative configuration of the exemplary structure after formation of solder material portions according to an embodiment of the present disclosure.

Referring to FIG. 13, a configuration of the exemplary structure according to an embodiment of the present disclosure is illustrated, which illustrates various components of the first device structure 920 within the first semiconductor die 900 and the second device structure 720 within the second semiconductor die 700.

Referring to all drawings and according to various embodiments of the present disclosure, a semiconductor structure comprising a first semiconductor die 900 is provided. The first semiconductor die 900 comprises: a first semiconductor substrate (9, 10) having a front surface 7 and a backside surface; first semiconductor devices located on the front surface 7 of the first semiconductor substrate (9, 10); first metal interconnect structures embedded in first dielectric material layers located on the first semiconductor devices, wherein the first metal interconnect structures comprise power-and-control-signal lines 122 located in a power and control signal connection region in a middle portion of the first semiconductor die 900; a first backside dielectric layer 610 located on the backside surface of the first semiconductor substrate (9, 10); integrated line and pad structures 620 including a respective first pad portion 620P that is more proximal to a periphery of the backside surface of the first semiconductor substrate (9, 10) than to a geometrical center GC of the backside surface of the first semiconductor substrate (9, 10), and including a respective first line portion 620L that extends continuously from the respective first pad portion 620P to a distal end region 620E of the respective first line portion 620L that is more proximal to the geometrical center GC than to the periphery of the backside surface; and power-and-control-signal through-substrate via structures 388 that electrically connect a respective one of the power-and-control-signal lines 124 located in the power and control signal connection region to the distal end region 620E of the line portion 620L of a respective one of the integrated line and pad structures 620.

In one embodiment, the integrated line and pad structures 620 have a uniform thickness within areas of the first pad portions 620P and areas of the first line portions 620L that do not overlie any of the first through-substrate via structures 388. In one embodiment, the distal end region 620E of each first line portion 620L comprises a via portion 620V that protrudes toward the first semiconductor substrate (9, 10) through the first backside dielectric layer 610 and contacts a respective one of the first through-substrate via structures 388.

In one embodiment, first line portions 620L have a first width, and the first pad portions 620P have a second width that is at least twice the first width. In one embodiment, solder material portions 660 can be bonded to the first pad portions 620P. In one embodiment, lengthwise directions of the first line portions 620L of the integrated line and pad structures 620 can be parallel to each other, and can be perpendicular to lengthwise edges of the first semiconductor die 900.

Second through-substrate via structures 386 can vertically extend through the first semiconductor substrate (9, 10), and can be located adjacent to the periphery of the backside surface of the first semiconductor substrate (9, 10). Pad structures 630 can be located on, and can extend through, the first backside dielectric layer 610, can contact a respective one of the second through-substrate via structures 386, and can be laterally spaced farther away from the geometrical center GC than one of the first pad portions 620P is from the geometrical center GC.

In one embodiment, the first semiconductor devices include a three-dimensional memory array that comprises: an alternating stack of insulating layers 32 and electrically conductive layers 46 that alternate along a vertical direction that is perpendicular to the front surface of the first semiconductor substrate (9, 10); and memory stack structures 55 vertically extending through the alternating stack (32, 46), wherein each of the memory stack structures 55 comprises a respective vertical semiconductor channel 60 and a respective memory film 50.

The semiconductor structure can comprise a second semiconductor die 700 comprising second semiconductor devices that form a control circuit for controlling operation of the three-dimensional memory array and bonded to the first semiconductor die 900 such that a front surface 7 of the first semiconductor substrate (9, 10) is more proximal to the second semiconductor die 700 than a backside surface of the first semiconductor substrate (9, 10) is to the second semiconductor die 700.

In one embodiment, the first semiconductor die 900 comprises first bonding pads 168 embedded in a first pad-level dielectric layer 960 located on the first dielectric material layers; the second semiconductor die 700 comprises second dielectric material layers 760 embedding second metal interconnect structures 780 and located on the second semiconductor devices, and a second pad-level dielectric layer 766 located on the second dielectric material layers 760 and embedding second bonding pads 768; and the first bonding pads 168 are bonded to the second bonding pads 768. In one embodiment, a subset of the power-and-control-signal through-substrate via structures 388 is electrically connected to a respective one of the second semiconductor devices 710 through a bonded pair of a respective one of the first bonding pads 158 and a respective one of the second bonding pads 768A.

In another embodiment, a bonded assembly comprises a first semiconductor die 900 and a second semiconductor die 700 bonded to the first semiconductor die. The first semiconductor die 900 comprises a first semiconductor substrate (9, 10) having a front surface and a backside surface; memory devices 910 located over the front surface of the first semiconductor substrate; first metal interconnect structures embedded in first dielectric material layers located on the first semiconductor devices, wherein the first metal interconnect structures comprise power-and-control-signal lines 122 located in a power and control signal connection region in a middle portion of the first semiconductor die 900; and first bonding pads 168 comprising power-and-control-signal bonding pads 168A located in the power and control signal connection region and electrically connected to the power-and-control-signal lines 122. The second semiconductor die 700 comprises second semiconductor devices 710 located in a peripheral control circuit region that form a peripheral control circuit for controlling operation of the memory devices 910; second bonding pads 768 that are located in a logic-side power-and-control-signal-path bonding pad region in a middle portion of the second semiconductor die and that are bonded to the power-and-control-signal bonding pads 168A; and second metal interconnect structures (782, 784) which electrically connect the second semiconductor devices in the peripheral control circuit region to the second bonding pads.

In one embodiment, the second semiconductor die 700 further comprises a sense amplifier circuit region (e.g., LBLHU). The peripheral control circuit region (e.g., LPERI) is located between the sense amplifier circuit region and the logic-side power-and-control-signal-path bonding pad region (e.g., LPCT) as shown in FIG. 6B. The second metal interconnect structures electrically connect the second semiconductor devices 710 in the peripheral control circuit region to the second bonding pads 768 located in the logic-side power-and-control-signal-path bonding pad region without passing over the sense amplifier circuit region.

The various embodiments of the present disclosure can employ integrated line and pad structures 620 including a respective pad portion 620P, a line portion 620L, and an end portion 602E containing a via portion 620V. The line portion 620L laterally extends between a middle portion of the backside surface of the first semiconductor substrate (9, 10) to a periphery (i.e., edge portion) of the backside surface of the first semiconductor substrate (9, 10). The solder material portions 660 may be located at the edge of the bonded assembly to permit stacking of multiple dies. Power and control signals provided from the external circuit through solder material portions 660 to the pad portions 620P can be laterally transmitted toward the middle portion of the backside surface of the first semiconductor substrate (9, 10) through the line portions 620L, and can be vertically transmitted through the first semiconductor substrate (9, 10) through the through-substrate via structures 386 or 586 and bonded pairs of first bonding pads 168 and the second bonding pads 768 into the second semiconductor die 700. By providing the power and control signals to the center region of the second semiconductor die 700, the wiring distance for distributing the power and the control signals in the bonded assembly is reduced. Furthermore, an extra level (e.g., fourth level) of metal interconnect lines in the second die 700 that is used in the prior art to extend the power and control signal metal interconnects from the periphery of the die over the sense amplifier region to the peripheral region can be avoided. In one embodiment shown in FIG. 13, only three levels of metal interconnect lines 784 can be used to distribute the power and the control signals through the second semiconductor die 700. Furthermore, the reduction in the amount of interconnects reduces the signal to noise ratio in the bonded assembly.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure comprising a first semiconductor die, wherein the first semiconductor die comprises:
a first semiconductor substrate having a front surface and a backside surface;
first semiconductor devices located over the front surface of the first semiconductor substrate;
first metal interconnect structures embedded in first dielectric material layers located on the first semiconductor devices, wherein the first metal interconnect structures comprise power-and-control-signal lines located in a power and control signal connection region in a middle portion of the first semiconductor die;
a first backside dielectric layer located on the backside surface of the first semiconductor substrate;
integrated line and pad structures including a respective first pad portion that is more proximal to a periphery of the backside surface of the first semiconductor substrate than to a geometrical center of the backside surface of the first semiconductor substrate, and including a respective first line portion that extends continuously from the respective first pad portion to a distal end region of the respective first line portion that is more proximal to the geometrical center than to the periphery of the backside surface; and
power-and-control-signal through-substrate via structures that electrically connect a respective one of the power-and-control-signal lines located in the power and control signal connection region to the distal end region of the line portion of a respective one of the integrated line and pad structures.

2. The semiconductor structure of claim 1, wherein the integrated line and pad structures have a uniform thickness within areas of the first pad portions and areas of the first line portions that do not overlie any of the power-and-control-signal through-substrate via structures.

3. The semiconductor structure of claim 2, wherein the distal end region of each first line portion comprises a via portion that protrudes toward the first semiconductor substrate through the first backside dielectric layer and contacts a respective one of the first through-substrate via structures.

4. The semiconductor structure of claim 1, wherein the first line portions have a first width, and the first pad portions have a second width that is at least twice the first width.

5. The semiconductor structure of claim 1, further comprising solder material portions bonded to the first pad portions.

6. The semiconductor structure of claim 1, wherein lengthwise directions of the first line portions of the integrated line and pad structures are parallel to each other.

7. The semiconductor structure of claim 1, further comprising second through-substrate via structures vertically extending through the first semiconductor substrate and located adjacent to the periphery of the backside surface of the first semiconductor substrate.

8. The semiconductor structure of claim 1, further comprising pad structures located on, and extending through, the first backside dielectric layer and contacting a respective one of the second through-substrate via structures and laterally spaced farther away from the geometrical center than one of the first pad portions is from the geometrical center.

9. The semiconductor structure of claim 1, wherein the first semiconductor devices comprise a three-dimensional memory array.

10. The semiconductor structure of claim 9, further comprising a second semiconductor die comprising second semiconductor devices that form a control circuit for controlling operation of the three-dimensional memory array and bonded to the first semiconductor die such that a front surface of the first semiconductor substrate is more proximal to the second semiconductor die than a backside surface of the first semiconductor substrate is to the second semiconductor die.

11. The semiconductor structure of claim 10, wherein:
the first semiconductor die comprises first bonding pads embedded in a first pad-level dielectric layer located on the first dielectric material layers;
the second semiconductor die comprises second dielectric material layers embedding second metal interconnect structures and located on the second semiconductor devices, and a second pad-level dielectric layer located on the second dielectric material layers and embedding second bonding pads;
the first bonding pads are bonded to the second bonding pads; and
a subset of the power-and-control-signal through-substrate via structures is electrically connected to a respective one of the second semiconductor devices through a bonded pair of a respective one of the first bonding pads and a respective one of the second bonding pads located in the power and control signal connection region.

12. The semiconductor structure of claim 9, wherein the three-dimensional memory array that comprises:
an alternating stack of insulating layers and electrically conductive layers that alternate along a vertical direction that is perpendicular to the front surface of the first semiconductor substrate; and
memory stack structures vertically extending through the alternating stack, wherein each of the memory stack structures comprises a respective vertical semiconductor channel and a respective memory film.

13. A bonded assembly, comprising:
a first semiconductor die; and
a second semiconductor die bonded to the first semiconductor die, wherein the first semiconductor die comprises:
a first semiconductor substrate having a front surface and a backside surface;
memory devices located over the front surface of the first semiconductor substrate;
first metal interconnect structures embedded in first dielectric material layers located on the first semiconductor devices, wherein the first metal interconnect structures comprise power-and-control-signal lines located in a power and control signal connection region in a middle portion of the first semiconductor die; and
first bonding pads comprising power-and-control-signal bonding pads located in the power and control signal connection region and electrically connected to the power-and-control-signal lines;
wherein the second semiconductor die comprises:
second semiconductor devices located in a peripheral control circuit region that form a peripheral control circuit for controlling operation of the memory devices;
a sense amplifier circuit region;
second bonding pads that are located in a logic-side power-and-control-signal-path bonding pad region in a middle portion of the second semiconductor die and that are bonded to the power-and-control-signal bonding pads; and
second metal interconnect structures which electrically connect the second semiconductor devices in the peripheral control circuit region to the second bonding pads without passing over the sense amplifier circuit region.

14. The bonded assembly of claim 13, wherein the peripheral control circuit region is located between the sense amplifier circuit region and the logic-side power-and-control-signal-path bonding pad region.

15. The bonded assembly of claim 14, wherein the first semiconductor die further comprises:
a first backside dielectric layer located on the backside surface of the first semiconductor substrate;
integrated line and pad structures including a respective first pad portion that is more proximal to a periphery of the backside surface of the first semiconductor substrate than to a geometrical center of the backside surface of the first semiconductor substrate, and including a respective first line portion that extends continuously from the respective first pad portion to a distal end region of the respective first line portion that is more proximal to the geometrical center than to the periphery of the backside surface; and
power-and-control-signal through-substrate via structures that electrically connect a respective one of the power-and-control-signal lines located in the power and control signal connection region to the distal end region of the line portion of a respective one of the integrated line and pad structures.

16. A method of forming a semiconductor structure comprising:
forming first semiconductor devices over a front surface of a first semiconductor substrate;
forming first through-substrate via structures in the first semiconductor substrate;
forming first dielectric material layers embedding first metal interconnect structures over the first semiconductor devices;
forming a first backside dielectric layer on a backside surface of the first semiconductor substrate; and forming integrated line and pad structures over the first backside dielectric layer on a respective one of the first through-substrate via structures, wherein each of the integrated line and pad structures comprises a respective first pad portion that is more proximal to a periphery of the backside surface of the first semiconductor substrate than to a geometrical center of the backside surface of the first semiconductor substrate, and comprises a respective first line portion that extends continuously from the respective first pad portion to a distal end region of the respective first line portion that is more proximal to the geometrical center than to the periphery of the backside surface.

17. The method of claim 16, wherein:

a subset of the first metal interconnect structures is formed on the first through-substrate via structures; and the first through-substrate via structures electrically connect a respective one of the first metal interconnect structures to the distal end region of the line portion of a respective one of the integrated line and pad structures.

18. The method of claim 16, further comprising:

forming openings through the first backside dielectric layer, wherein horizontal surfaces of the first through-substrate via structures are physically exposed;

forming a metallic material layer over the first backside dielectric layer and on the horizontal surfaces of the first through-substrate via structures;

patterning the metallic material layer to form the integrated line and pad structures which comprise patterned portions of the metallic material layer; and forming a solder material portion on each of the bonding pad portions.

19. The method of claim 16, further comprising:

bonding a second semiconductor die to the first semiconductor die such that the second semiconductor die faces the front surface of the first semiconductor substrate; and thinning a backside of the first semiconductor substrate, wherein surfaces of the first through-substrate via structures are physically exposed on a backside surface of the first semiconductor substrate after thinning the backside of the first semiconductor substrate.

20. The method of claim 19, wherein:

the first semiconductor devices include a three-dimensional memory array that comprises an alternating stack of insulating layers and electrically conductive layers that alternate along a vertical direction that is perpendicular to the front surface of the first semiconductor substrate, and memory stack structures vertically extending through the alternating stack;

each of the memory stack structures comprises a respective vertical semiconductor channel and a respective memory film;

the second semiconductor die comprises second semiconductor devices that form control circuit for controlling operation of the three-dimensional memory array;

the first semiconductor die comprises first bonding pads embedded in a first pad-level dielectric layer located on the first dielectric material layers;

the second semiconductor die comprises second dielectric material layers embedding second metal interconnect structures and located on the second semiconductor devices, and a second pad-level dielectric layer located on the second dielectric material layers and embedding second bonding pads; and the method further comprises bonding the first bonding pads to the second bonding pads.

\* \* \* \* \*